US012787853B2

(12) United States Patent
Lum et al.

(10) Patent No.: US 12,787,853 B2
(45) Date of Patent: Nov. 3, 2026

(54) MOLDED MEMORY ASSEMBLIES FOR A SYSTEM IN PACKAGE SEMICONDUCTOR DEVICE ASSEMBLY

(71) Applicant: Micron Technology, Inc., Boise, ID (US)

(72) Inventors: Wen Wei Lum, Singapore (SG); Kelvin Aik Boo Tan, Singapore (SG); Seng Kim Ye, Singapore (SG)

(73) Assignee: Micron Technology, Inc., Boise, ID (US)

( * ) Notice: Subject to any disclaimer, the term of this patent is extended or adjusted under 35 U.S.C. 154(b) by 384 days.

(21) Appl. No.: 18/406,690

(22) Filed: Jan. 8, 2024

(65) Prior Publication Data

US 2024/0260281 A1 Aug. 1, 2024

Related U.S. Application Data

(60) Provisional application No. 63/481,727, filed on Jan. 26, 2023.

(51) Int. Cl.
*H10W 90/24* (2026.01)
*H10B 80/00* (2023.01)
(Continued)

(52) U.S. Cl.
CPC .......... *H10W 74/121* (2026.01); *H10B 80/00* (2023.02); *H10W 70/095* (2026.01);
(Continued)

(58) Field of Classification Search
CPC ............... H10W 70/09; H10W 74/121; H10W 74/131; H10W 74/137; H10W 74/141; H10W 90/291; H10W 70/095; H10W 70/635; H10W 90/00; H10W 72/5522; H10W 72/5525; H10W 74/117; H10W 90/752; H10W 90/754; H10W 90/24; H10W 72/50; H10W 20/20; H10W 74/01;
(Continued)

(56) References Cited

U.S. PATENT DOCUMENTS

| | | | | |
|---|---|---|---|---|
| 6,376,904 | B1 * | 4/2002 | Haba ................... | H10W 74/117 257/691 |
| 7,863,109 | B2 * | 1/2011 | Chow ................. | H10W 74/019 257/730 |
| 8,253,232 | B2 * | 8/2012 | Kim .................... | H10W 74/117 257/784 |
| 8,664,780 | B2 * | 3/2014 | Han .................... | H10W 74/121 257/778 |

(Continued)

*Primary Examiner* — Eduardo A Rodela
(74) *Attorney, Agent, or Firm* — Harrity & Harrity, LLP

(57) ABSTRACT

Implementations described herein relate to various semiconductor device assemblies. In some implementations, a molded memory device may include multiple stacked NAND dies electrically coupled to one another via multiple wire bonds. The molded memory device may include a molded casing surrounding the multiple stacked NAND dies and encapsulating the multiple wire bonds, with the molded casing including a first mold surrounding a first portion of a first NAND die, of the multiple stacked NAND dies, and a second mold partially surrounding a second portion of the first NAND die and each additional NAND die, of the multiple NAND dies. The molded memory device may include multiple copper contacts configured to couple the molded memory device to a substrate associated with a system in package, with the plurality of copper contacts being disposed in the first mold.

20 Claims, 15 Drawing Sheets

(51) Int. Cl.

| | |
|---|---|
| ***H10W 70/05*** | (2026.01) |
| ***H10W 70/63*** | (2026.01) |
| ***H10W 74/10*** | (2026.01) |
| ***H10W 90/00*** | (2026.01) |
| ***H10W 90/20*** | (2026.01) |
| *H10W 72/50* | (2026.01) |

(52) U.S. Cl.
CPC ......... *H10W 70/635* (2026.01); *H10W 90/00* (2026.01); *H10W 90/291* (2026.01); *H10W 72/5522* (2026.01); *H10W 72/5525* (2026.01); *H10W 74/117* (2026.01); *H10W 90/752* (2026.01); *H10W 90/754* (2026.01)

(58) Field of Classification Search
CPC ............. H10W 90/20; H10W 72/9413; H10W 72/9415; H10B 80/00
See application file for complete search history.

(56) References Cited

U.S. PATENT DOCUMENTS

| | | | | |
|---|---|---|---|---|
| 10,593,647 | B2 * | 3/2020 | Chang Chien | H10W 90/00 |
| 12,191,221 | B2 * | 1/2025 | Kwon | H10W 74/117 |
| 2008/0105962 | A1 * | 5/2008 | Lee | H10W 90/00<br>257/686 |
| 2014/0175638 | A1 * | 6/2014 | Kim | H10W 70/635<br>257/737 |
| 2016/0225744 | A1 * | 8/2016 | Nam | H10W 74/114 |
| 2019/0295858 | A1 * | 9/2019 | Athavale | H10F 39/804 |
| 2020/0251447 | A1 * | 8/2020 | Kang | H10W 90/00 |
| 2021/0167039 | A1 * | 6/2021 | Zeng | H10W 42/121 |
| 2023/0060586 | A1 * | 3/2023 | Ahn | H10W 90/00 |
| 2023/0178502 | A1 * | 6/2023 | Goh | H10W 90/00<br>257/777 |
| 2023/0260975 | A1 * | 8/2023 | Tan | H10W 74/016<br>257/686 |
| 2024/0170456 | A1 * | 5/2024 | Kyung | H10W 72/073 |

* cited by examiner

MOLDED MEMORY ASSEMBLIES FOR A SYSTEM IN PACKAGE SEMICONDUCTOR DEVICE ASSEMBLY

CROSS REFERENCE TO RELATED APPLICATION

This Patent Application claims priority to U.S. Provisional Patent Application No. 63/481,727, filed on Jan. 26, 2023, and entitled "MOLDED MEMORY ASSEMBLIES FOR A SYSTEM IN PACKAGE SEMICONDUCTOR DEVICE ASSEMBLY." The disclosure of the prior Application is considered part of and is incorporated by reference into this Patent Application.

TECHNICAL FIELD

The present disclosure generally relates to semiconductor devices and methods of forming semiconductor devices. For example, the present disclosure relates to molded memory assemblies for a system in package (SiP) semiconductor device assembly.

BACKGROUND

A semiconductor package includes a casing that contains one or more semiconductor devices, such as integrated circuits. Semiconductor device components may be fabricated on semiconductor wafers before being diced into die and then packaged. A semiconductor package protects internal components from damage and includes means for connecting internal components to external components (e.g., a circuit board), such as via balls, pins, or leads. A semiconductor device assembly may be or may include a semiconductor package or one or more components of a semiconductor package (e.g., one or more semiconductor devices with or without a casing).

DETAILED DESCRIPTION

Figure 1:
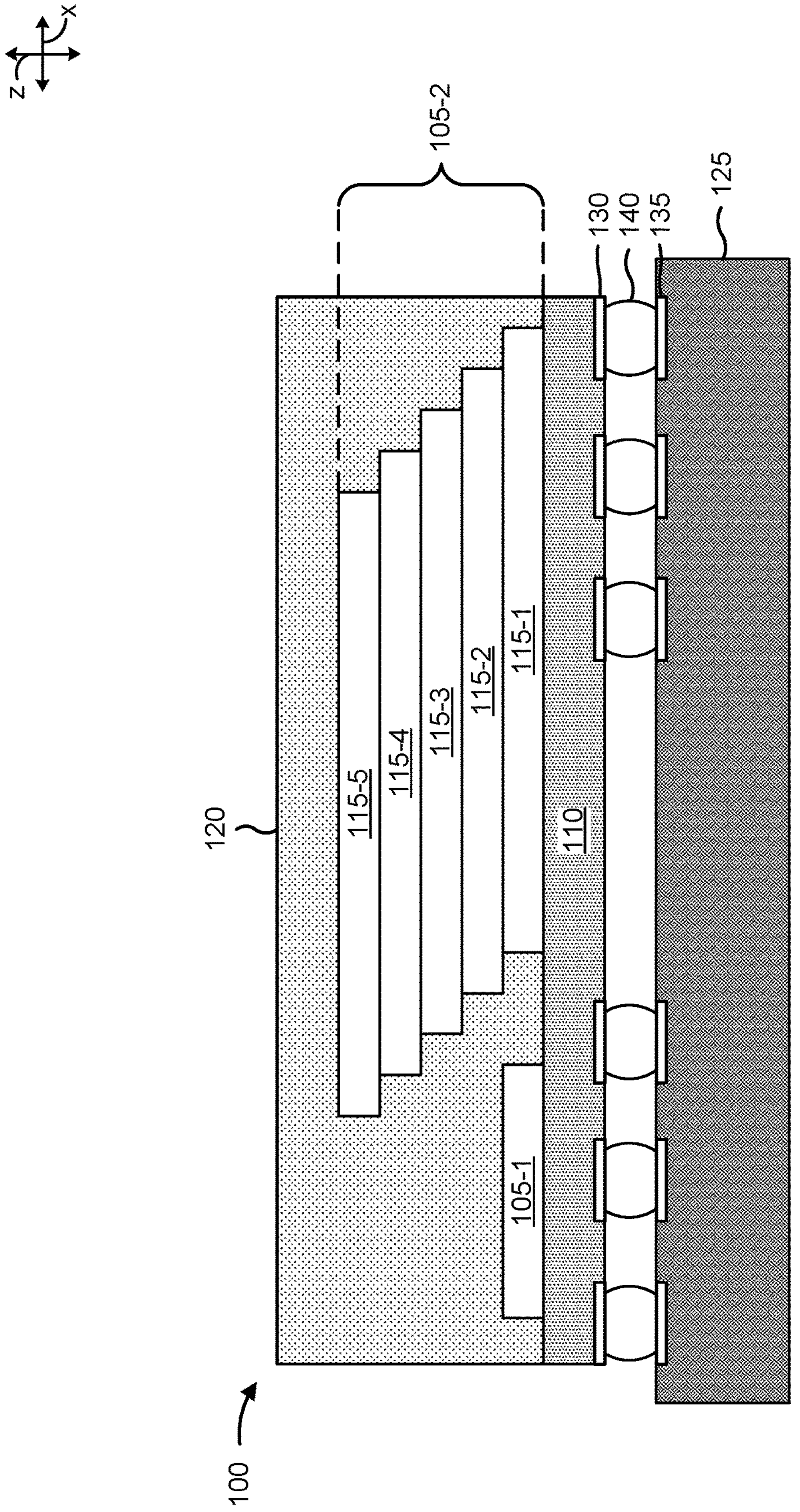
FIG. 1 is a diagram of an example apparatus associated with integrated circuits.

Some semiconductor packages include multiple semiconductor devices encapsulated in a casing, which may be a mold compound (sometimes referred to simply as a "mold") or similar molded casing. The casing may protect the various semiconductor devices from damage, including encapsulating and thus protecting various electrical connections (e.g., wire bonds, bump bonds, or similar electrical connections) associated with the semiconductor devices from corrosion or other damage. For example, in a system in package (SiP) semiconductor device assembly, multiple integrated circuits, such as a controller, memory dies, or similar integrated circuits, may be electrically bonded to a substrate by multiple wire bonds, bump bonds, or other electrical bonds, and then enclosed in a casing. In some examples, an SiP semiconductor device may include additional components coupled to the substrate and/or enclosed in the casing, such as resistors, capacitors, or similar electronic components.

Such SiP semiconductor device assemblies or similar packages may be prone to high yield lost at the manufacturing level due to the inaccessibility of the individual semiconductor devices once the devices are encapsulated in the mold compound or similar molded casing. For example, if the SiP semiconductor device assembly is not operating correctly after fabrication, the entire package must be disposed because the individual semiconductor devices encapsulated in the mold compound and thus not accessible for troubleshooting, repair, or replacement. Moreover, because the various semiconductor devices are encapsulated in the mold compound or similar casing, the individual components cannot later be upgraded or replaced. Instead, if an upgrade for one of semiconductor devices is desired and/or if a replacement of one of the semiconductor devices is necessary, an entirely new SiP semiconductor device assembly may need to used. Furthermore, because the various semiconductor devices that become encapsulated in the mold compound or similar casing may not be accessible, the various components cannot later be tested or otherwise accessed.

Some implementations described herein enable an SiP semiconductor device assembly or similar package incorporating individual molded die assemblies, which may be individually accessed and/or replaced, thus improving yield lost and otherwise increasing the flexibility of the semiconductor package for component testing and replacement purposes. In some implementations, an SiP semiconductor device assembly or similar semiconductor package may include a substrate (e.g., a printed circuit board (PCB)) and multiple molded memory assemblies (e.g., one or more molded NAND stacks, a molded dynamic random access memory (DRAM) die, and/or a similar molded memory assembly) electrically coupled to the substrate. For example, the semiconductor package may include a non-volatile molded memory assembly that includes one or more memory dies and/or wire bonds encapsulated in a first molded casing, as well as a volatile molded memory assembly that includes one or more dies and/or wire bonds encapsulated in a second molded casing. In that way, the molded memory assemblies may be individually accessible and, if necessary, replaceable. As a result, a yield lost associated with manufacturing an SiP semiconductor device assembly or similar package may be reduced, because faulty components may be individually replaced rather than requiring replacement of an entire semiconductor package. Moreover, the components may be individually accessible for purposes of testing, replacement, and/or upgrade, improving the flexibility of the semiconductor package for use in a variety of applications and products. These and other features are described in more detail below in connection with accompanying figures.

FIG. 1 is a diagram of an example apparatus 100 associated with integrated circuits.

In FIG. 1 and the figures that follow, each of the illustrated x-axis, y-axis, and z-axis is substantially perpendicular to the other two axes. In other words, the x-axis is substantially perpendicular to the y-axis and the z-axis, the y-axis is substantially perpendicular to the x-axis and the z-axis, and the z-axis is substantially perpendicular to the x-axis and the y-axis. In some cases, a single reference number is shown to refer to a surface, or fewer than all instances of a part may be labeled with all surfaces of that part. All instances of the part may include associated surfaces of that part despite not every surface being labeled.

The apparatus 100 may include any type of device or system that includes one or more integrated circuits 105. For example, the apparatus 100 may include a memory device, a flash memory device, a NAND memory device, a NOR memory device, a random access memory (RAM) device, a read-only memory (ROM) device, a DRAM device, a static RAM (SRAM) device, a synchronous dynamic RAM (SDRAM) device, a ferroelectric RAM (FeRAM) device, a magnetic RAM (MRAM) device, a resistive RAM (RRAM) device, a holographic RAM (HRAM) device, a solid state drive (SSD), a microchip, and/or a system on a chip (SoC), among other examples. In some cases, the apparatus 100 may be referred to as a semiconductor package, an assembly, a semiconductor device assembly, or an integrated assembly.

As shown in FIG. 1, the apparatus 100 may include one or more integrated circuits 105, shown as a first integrated circuit 105-1 and a second integrated circuit 105-2, disposed on a substrate 110. An integrated circuit 105 may include any type of circuit, such as an analog circuit, a digital circuit, a radiofrequency (RF) circuit, a power supply, a power management circuit, an input-output (I/O) chip, an application-specific integrated circuit (ASIC), a field-programmable gate array (FPGA), and/or a memory device (e.g., a NAND memory device, a NOR memory device, a RAM device, or a ROM device). An integrated circuit 105 may be mounted on or otherwise disposed on a surface of the substrate 110. Although the apparatus 100 is shown as including two integrated circuits 105 as an example, the apparatus 100 may include a different number of integrated circuits 105.

In some implementations, an integrated circuit 105 may include a single semiconductor die 115 (sometimes called a die), as shown by the first integrated circuit 105-1. In some implementations, an integrated circuit 105 may include multiple semiconductor dies 115 (sometimes called dies), as shown by the second integrated circuit 105-2, which is shown as including five semiconductor dies 115-1 through 115-5.

As shown in FIG. 1, for an integrated circuit 105 that includes multiple dies 115, the dies 115 may be stacked on top of each other to reduce a footprint of the apparatus 100. In some implementations, a spacer may be present between dies 115 that are adjacent to one another in the stack to enable electrical separation and heat dissipation. The stacked dies 115 may include three-dimensional electrical interconnects, such as through-silicon vias (TSVs), to route electrical signals between dies 115. Although the integrated circuit 105-2 is shown as including five dies 115, an integrated circuit 105 may include a different number of dies 115 (e.g., at least two dies 115). A first die 115-1 (sometimes called a bottom die or a base die) may be disposed on the substrate 110, a second die 115-2 may be disposed on the first die 115-1, and so on. Although FIG. 1 shows the dies 115 stacked in a shingle stack (e.g., with die edges that are not aligned, which provides space for wire bonding near the edges of the dies 115), in some implementations, the dies 115 may be stacked in a different arrangement, such as a straight stack (e.g., with aligned die edges).

The apparatus 100 may include a casing 120 that protects internal components of the apparatus 100 (e.g., the integrated circuits 105) from damage and environmental elements (e.g., particles) that can lead to malfunction of the apparatus 100. The casing 120 may be a mold compound, a plastic (e.g., an epoxy plastic), a ceramic, or another type of material depending on the functional requirements for the apparatus 100.

In some implementations, the apparatus 100 may be included as part of a higher level system (e.g., a computer, a mobile phone, a network device, an SSD, a vehicle, or an Internet of Things device), such as by electrically connecting the apparatus 100 to a circuit board 125, such as a printed circuit board. For example, the substrate 110 may be disposed on the circuit board 125 such that electrical contacts 130 (e.g., bond pads) of the substrate 110 are electrically connected to electrical contacts 135 (e.g., bond pads) of the circuit board 125.

In some implementations, the substrate 110 may be mounted on the circuit board 125 using solder balls 140 (e.g., arranged in a ball grid array), which may be melted to form a physical and electrical connection between the substrate 110 and the circuit board 125. Additionally, or alternatively, the substrate 110 may be mounted on and/or electrically connected to the circuit board 125 using another type of connector, such as pins or leads. Similarly, an integrated circuit 105 may include electrical pads (e.g., bond pads) that are electrically connected to corresponding electrical pads (e.g., bond pads) of the substrate 110 using electrical bonding, such as wire bonding, bump bonding, or the like. The interconnections between an integrated circuit 105, the substrate 110, and the circuit board 125 enable the integrated circuit 105 to receive and transmit signals to other components of the apparatus 100 and/or the higher level system.

As indicated above, FIG. 1 is provided as an example. Other examples may differ from what is described with regard to FIG. 1.

Figure 2:
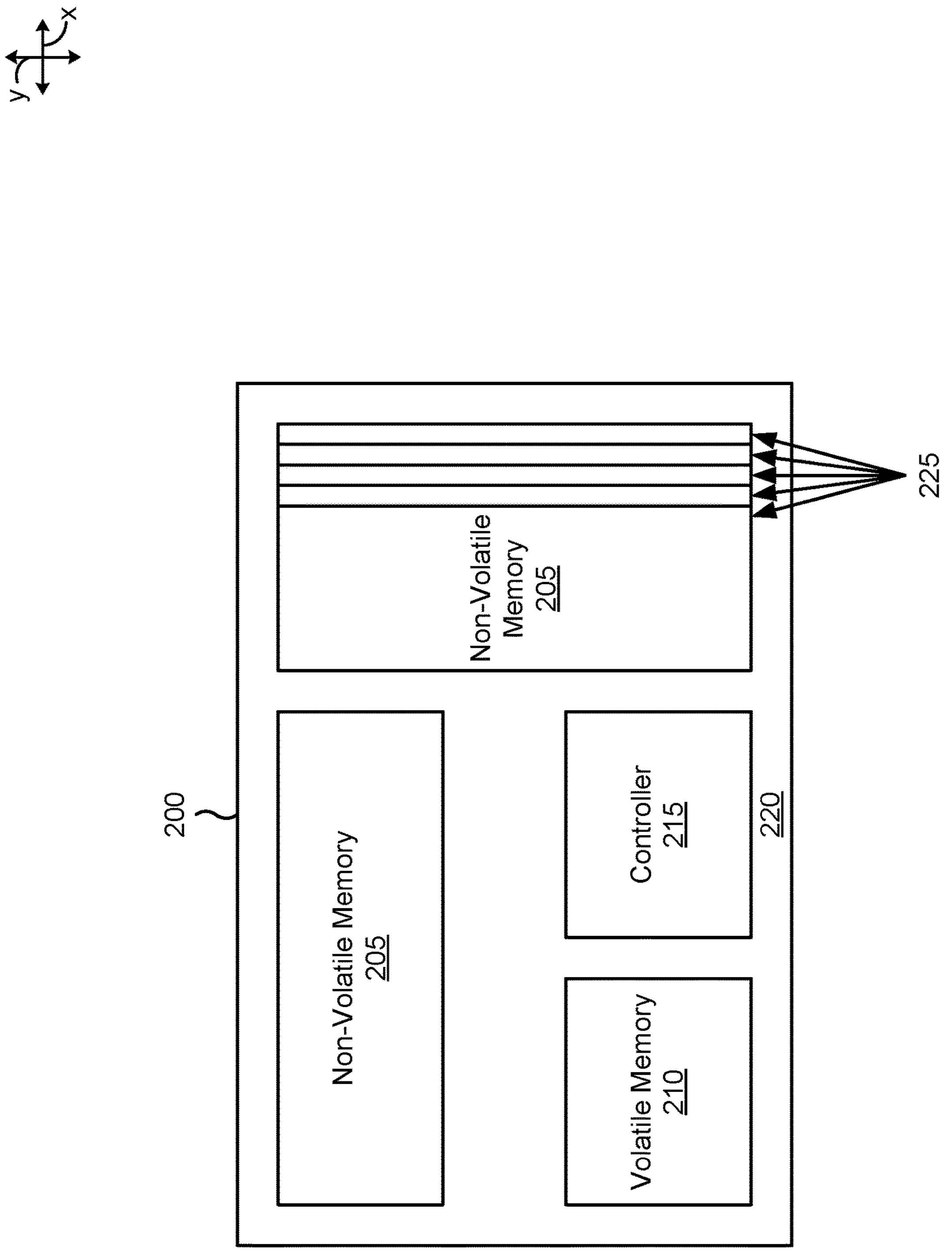
FIG. 2 is a diagram of an example memory device associated with integrated circuits.

FIG. 2 is a diagram of an example memory device 200 associated with integrated circuits. The memory device 200 is an example of the apparatus 100 described above in connection with FIG. 1. The memory device 200 may be any electronic device configured to store data in memory. In some implementations, the memory device 200 may be an electronic device configured to store data persistently in non-volatile memory 205. For example, the memory device 200 may be a hard drive, an SSD, a flash memory device (e.g., a NAND flash memory device or a NOR flash memory device), a universal serial bus (USB) thumb drive, a memory card (e.g., a secure digital (SD) card), a secondary storage device, a non-volatile memory express (NVMe) device, -an embedded multimedia card (eMMC) device, and/or an SiP semiconductor device assembly.

As shown, the memory device 200 may include non-volatile memory 205, volatile memory 210, and a controller 215. The components of the memory device 200 may be mounted on or otherwise disposed on a substrate 220. In some implementations, the non-volatile memory 205 includes a single die. Additionally, or alternatively, the non-volatile memory 205 may include multiple dies, such as stacked semiconductor dies 225 (e.g., in a straight stack, a shingle stack, or another type of stack), as described above in connection with FIG. 1.

The non-volatile memory 205 may be configured to maintain stored data after the memory device 200 is powered off. For example, the non-volatile memory 205 may include NAND memory or NOR memory. The volatile memory 210 may require power to maintain stored data and may lose stored data after the memory device 200 is powered off. For example, the volatile memory 210 may include one or more latches and/or RAM, such as DRAM and/or SRAM. As an example, the volatile memory 210 may cache data read from or to be written to non-volatile memory 205, and/or may cache instructions to be executed by the controller 215.

The controller 215 may be any device configured to communicate with the non-volatile memory 205, the volatile memory 210, and a host device (e.g., via a host interface of the memory device 200). For example, the controller 215 may include a memory controller, a system controller, an ASIC, an FPGA, a processor, a microcontroller, and/or one or more processing components. In some implementations, the memory device 200 may be included in a system that includes the host device. The host device may include one or more processors configured to execute instructions and store data in the non-volatile memory 205.

The controller 215 may be configured to control operations of the memory device 200, such as by executing one or more instructions (sometimes called commands). For example, the memory device 200 may store one or more instructions as firmware, and the controller 215 may execute those one or more instructions.

Additionally, or alternatively, the controller 215 may receive one or more instructions from a host device via a host interface, and may execute those one or more instructions. For example, the controller 215 may transmit signals to and/or receive signals from the non-volatile memory 205 and/or the volatile memory 210 based on the one or more instructions, such as to transfer data to (e.g., write or program), to transfer data from (e.g., read), and/or to erase all or a portion of the non-volatile memory 205 (e.g., one or more memory cells, pages, sub-blocks, blocks, or planes of the non-volatile memory 205).

As indicated above, FIG. 2 is provided as an example. Other examples may differ from what is described with regard to FIG. 2. The number and arrangement of components shown in FIG. 2 are provided as an example. In practice, there may be additional components, fewer components, different components, or differently arranged components than those shown in FIG. 2.

Figure 3A:
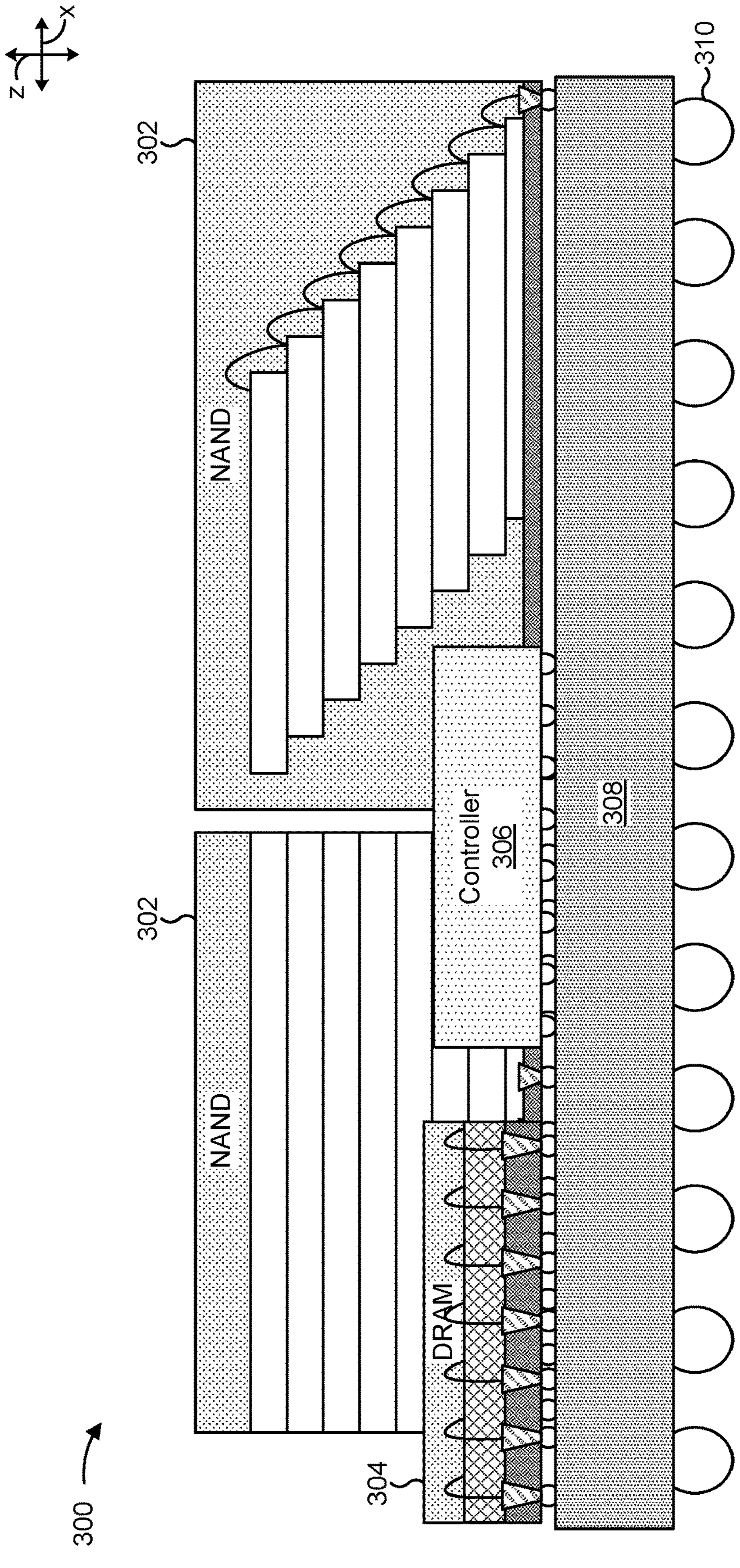
FIGS. 3A-3C are diagrams of an example semiconductor package that includes molded memory assemblies.
Figure 3B:
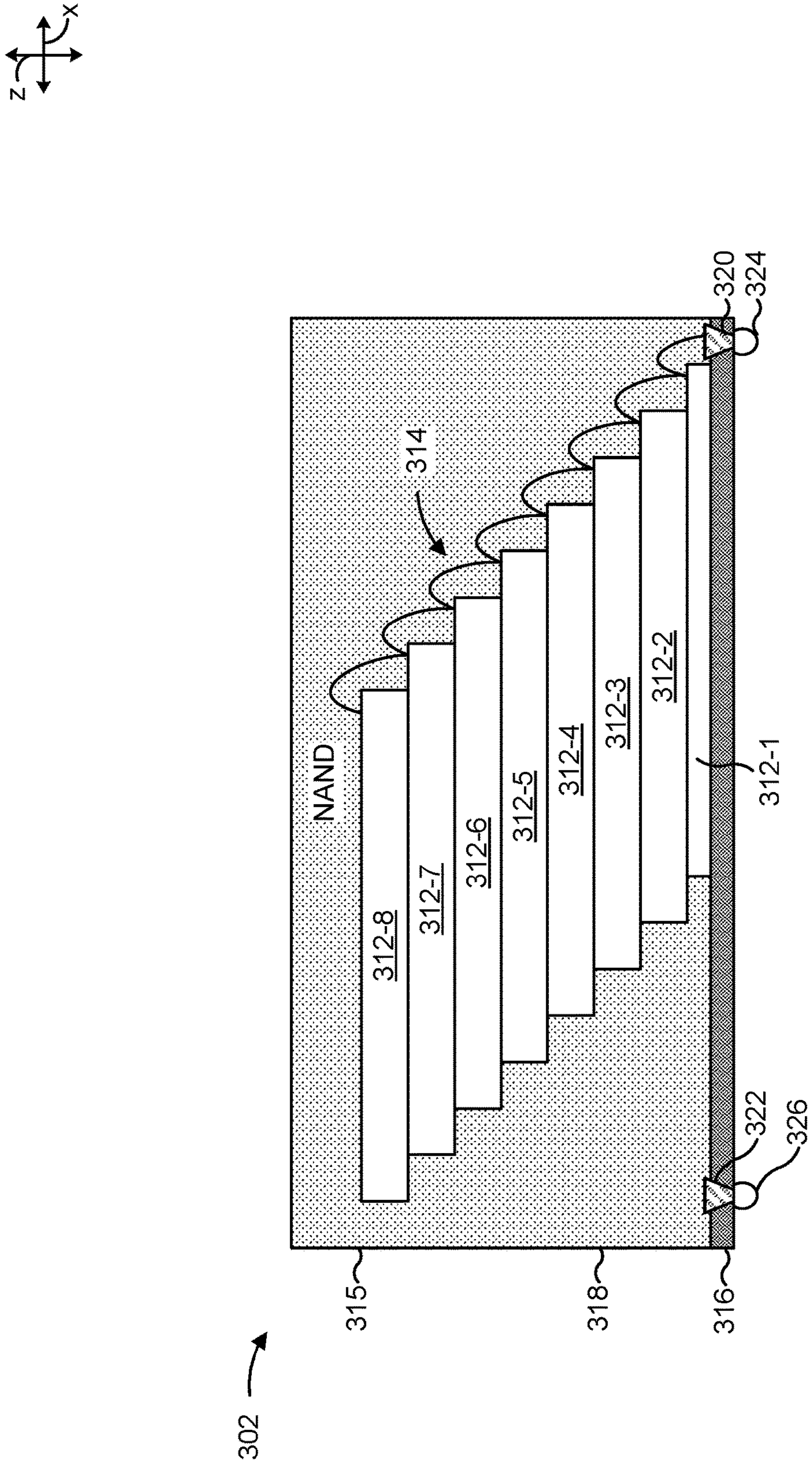
Figure 3C:
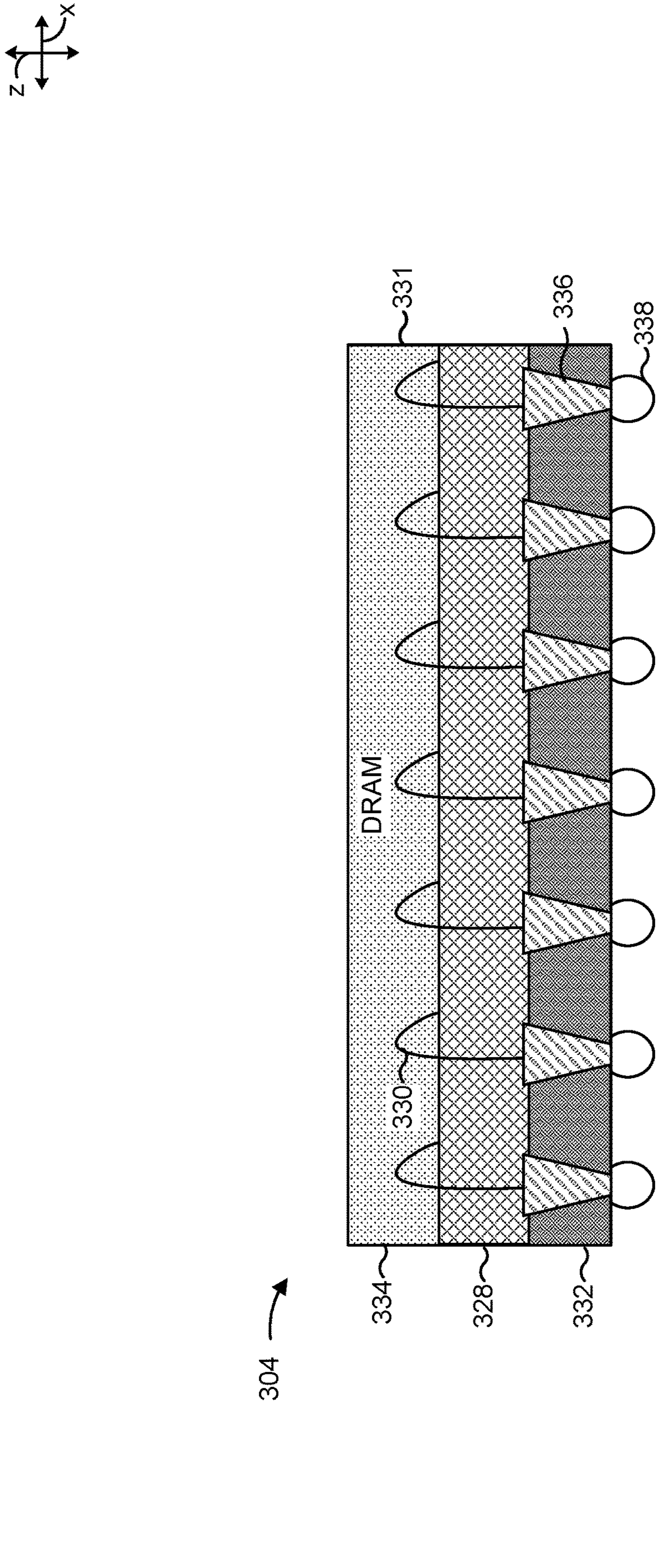

FIGS. 3A-3C are diagrams of an example semiconductor package 300 that includes molded memory assemblies as well as the individual molded memory assemblies thereof. More particularly, FIG. 3A shows the semiconductor package 300, which may be an SiP semiconductor device assembly or similar package, and FIGS. 3B-3C show various components of the example semiconductor package 300 in more detail, including a non-volatile molded memory assembly 302 in FIG. 3B and a volatile molded memory assembly 304 in FIG. 3C.

As shown in FIG. 3A, the semiconductor package 300 may include multiple semiconductor devices. For example, the semiconductor package 300 may include multiple molded memory assemblies electrically coupled to a substrate 308, such as one or more non-volatile molded memory assemblies 302 and a volatile molded memory assembly 304, and/or a controller 306 electrically coupled to the substrate 308, among other components (e.g., capacitors, resistors, and/or other electronic components). Each of the various components may be coupled to the substrate 308 via multiple bump bonds or similar electrical connections, which is described below in more detail. The semiconductor package 300 may further include a number of solder balls 310 configured to electrically couple the semiconductor package 300 to a larger system, and, more particularly, to a substrate (e.g., a PCB) associated with the larger system, such as via a solder reflow process, a flip-chip attachment process, or a similar process.

In some implementations, the one or more non-volatile molded memory assemblies 302 may be associated with a non-volatile memory (e.g., NAND memory), such as the non-volatile memory 205 described above in connection with FIG. 2. Additionally, or alternatively, the volatile molded memory assembly 304 may be associated with a volatile memory (e.g., DRAM), such as the volatile memory 210 described above in connection with FIG. 2. Moreover, the controller 306 (e.g., controller 215) may be electrically coupled to the one or more non-volatile molded memory assemblies 302 and/or the volatile molded memory assembly 304 via the substrate 308, and/or the controller 306 may be configured to control one or more operations associated with the one or more non-volatile molded memory assemblies 302 and/or the volatile molded memory assembly 304.

As can be seen in FIG. 3A, and unlike the apparatus 100 described above in connection with FIG. 1 in which the various components are encapsulated in a common casing 120, the semiconductor package 300 may not include a casing surrounding the various components coupled to the substrate 308. Instead, one or more of the components may be individually molded and/or encapsulated in a corresponding casing. For example, the multiple non-volatile molded memory assemblies 302 (e.g., molded NAND assemblies) may each including a corresponding casing, and/or the volatile molded memory assembly 304 (e.g., a molded DRAM assembly) may include a corresponding casing.

More particularly, FIG. 3B shows one of the non-volatile molded memory assemblies 302 in more detail, and FIG. 3C shows the volatile molded memory assembly 304 in more detail. First, as shown in FIG. 3B, the non-volatile molded memory assembly 302 may include multiple stacked dies 312 (shown as dies 312-1 through 312-8 in FIG. 3B). For example, the non-volatile molded memory assembly 302 may be associated with a NAND memory, and thus the stacked dies 312 may be a NAND stack. In some implementations, the multiple stacked dies 312 may be electrically coupled to one another via multiple wire bonds 314 (e.g., gold and/or copper wire soldered between electrical contacts of the various dies 312). In such implementations, the dies 312, the multiple wire bonds 314, or similar components may be encapsulated in one or more molds, thereby protecting the components from exposure, corrosion, and other environmental hazards.

For example, the non-volatile molded memory assembly 302 may include a molded casing 315 surrounding the multiple dies 312 and/or encapsulating the multiple wire bonds 314. In some implementations, the molded casing 315 may include a first molded layer including a first mold compound 316 surrounding a perimeter of a first die 312-1 (e.g., a lowermost die, in the z-axis direction), of the multiple stacked dies 312, and at least partially encasing the first die 312-1, in the z-axis direction. The molded casing 315 may further include a second molded layer including a second mold compound 318 partially encasing the first die 312-1 (e.g., the lowermost die), in the z-axis direction, and which encases each additional die 312, of the plurality of stacked dies 312 (e.g., die 312-2 through die 312-8). Additionally, or alternatively, the multiple dies 312 may be coupled and/or adhered to one another, such as via a die attach film (DAF) or similar adhesive provided between each successive die 312. As shown in FIG. 3B, the first molded layer 316 may be relatively thin, in the z-axis direction, and the second mold compound 318 may be relatively thick, in the z-axis direction. More particularly, the first molded layer 316 may form a relatively thin base layer of the non-volatile molded memory assembly 302, and the second molded layer may encompass substantially an entire thickness, in the z-axis direction, of the non-volatile molded memory assembly 302.

In some implementations, the non-volatile molded memory assembly 302 may include multiple metallic (e.g., copper) contacts configured to couple the non-volatile molded memory assembly 302 to the substrate 308 associated with semiconductor package 300. More particularly, the non-volatile molded memory assembly 302 may include multiple metallic contacts disposed in the first mold compound 316. For example, the non-volatile molded memory assembly 302 may include a first subset of contacts 320 (e.g., the contact 320 visible in the view shown in FIG. 3B, as well as multiple other contacts 320 aligned with the contact 320 shown in FIG. 3B along the y-axis direction) and a second subset of contacts 322 (e.g., the contact 322 visible in the view shown in FIG. 3B, as well as multiple other contacts 322 aligned with the contact 322 shown in FIG. 3B along the y-axis direction) in the first mold compound 316. In some implementations, some of the contacts may be configured to provide an electrical connection between the non-volatile molded memory assembly 302 (and, more particularly, the stacked dies 312 of the non-volatile molded memory assembly 302) and the substrate 308, while other ones of the contacts may be electrically isolated from the stacked dies 312 and thus may serve to provide a mechanical connection between the non-volatile molded memory assembly 302 and the substrate 308 but not an electrical connection. Put another way, in some implementations, the first subset of contacts 320 are configured to provide an electrical connection between the stacked dies 312 and the substrate 308 (e.g., via the multiple wire bonds 314 being electrically coupled to the first subset of contacts 320), and the second subset of contacts 322 may be electrically isolated from the stacked dies 312 and/or may not otherwise provide an electrical connection between the stacked dies 312 and the substrate 308.

Moreover, as shown in FIG. 3B, in some implementations, the thin, first molded layer may include interconnections (e.g., the subsets of contacts 320, 322, which may be copper-filled laser via holes as described in more detail below in connection with FIG. 4B) from an upper surface of the first molded layer to a lower surface of the first molded layer, and the thicker, second molded layer, may not include such interconnections and/or may only embed electrical connections (e.g., wire bonds 314) within the second molded layer. Additionally, or alternatively, certain mechanical properties of the first mold compound 316 (which forms the first molded layer) may differ from the second mold compound 318 (which forms the second molded layer). For example, in some implementations, the first mold compound 316 may exhibit a higher modulus of elasticity than the second mold compound 318, which may stiffen a base layer of the non-volatile molded memory assembly 302 and thus provide increased rigidity to the non-volatile molded memory assembly 302 to reduce cracking or other die failure. Moreover, the second mold compound 318 may exhibit a lower coefficient of thermal expansion (CTE) as compared to the first mold compound 316, which may control warpage or other deformation of the non-volatile molded memory assembly 302. In some implementations, the second mold compound 318 may exhibit a relatively high thermal conductivity (k) (e.g., the second mold compound 318 may be a high-k mold compound) in order to improve thermal dissipation extraction to a top surface, in the z-axis direction, of the non-volatile molded memory assembly 302. For example, a typical mold compound used to form the casing of a semi-conductor package (e.g., casing 120 of apparatus 100) may exhibit a thermal conductivity of less than 1 Watts per meter Kelvin (W/mK). In some implementations, a thermal conductivity of the second mold compound 318 may be higher than 1 W/mK, such as greater than or equal to 8.7 W/mK.

In some implementations, the non-volatile molded memory assembly 302 may be configured to be bonded to the substrate 308 via multiple micro balls (e.g., micro solder balls) or similar bump bonds coupling the contacts 320, 322 to corresponding bond pads, lead fingers, terminals, or similar contacts disposed on a surface of the substrate 308 (which are described in more detail below in connection with FIG. 4F). For example, in the implementation depicted in FIG. 3B, the first subset of contacts 320 may be configured to be coupled to the substrate 308 via a first set of micro balls 324, and the second subset of contacts 322 may be configured to be coupled to the substrate 308 via a second set of micro balls 326. In implementations in which certain contacts 320, 322 do not provide an electrical connection to the dies 312 of the non-volatile molded memory assembly 302, the corresponding micro balls 324, 326 may serve only to mechanically (and not electrically) couple the non-volatile molded memory assembly 302 to the substrate 308. For example, in implementations in which the second set of micro balls 326, which are disposed at the electrically isolated second subset of contacts 322, provide a mechanical connection between the non-volatile molded memory assembly 302 and the substrate 308 but not an electrical connection, the set of micro balls 326 may serve only to mechanically (and not electrically) couple the non-volatile molded memory assembly 302 to the substrate 308. In some implementations, the micro balls that provide a mechanical connection, but not an electrical connection, between a molded memory assembly and the substrate 308 may be referred to as "dummy micro balls" or simply "dummy balls."

Although for ease of discussion only two subsets of contacts 320, 322 are shown in FIG. 3B, in some other implementations, more contacts may be disposed in the first mold compound 316. More particularly, additional subsets of contacts may be included in the first mold compound 316 to provide additional mechanical and/or electrical bonds between the non-volatile molded memory assembly 302 and the substrate 308 and/or to provide increased stability, such as in the case of relatively long, in the x-axis direction, molded memory assemblies 302 that may otherwise droop or sag when only supported at the distal ends thereof. For example, another subset of contacts may be disposed in the first mold compound 316 approximately at a center, in the x-axis direction, of the first mold compound 316. In some other implementations, multiple additional subsets of contacts may be disposed between the first subset of contacts 320 and the second subset of contacts 322, which may be approximately evenly distributed in the x-axis direction, in order to provide increased bonding contacts and/or stability.

As described above in connection with FIG. 3A, the semiconductor package 300 may include molded memory assemblies in addition to the one or more non-volatile molded memory assemblies 302. For example, the semiconductor package 300 may include the volatile molded memory assembly 304 coupled to the substrate 308, which is shown in more detail in FIG. 3C. In such implementations, the volatile molded memory assembly 304 may be associated with a different type of memory than the one or more non-volatile molded memory assemblies 302. For example, the one or more non-volatile molded memory assemblies 302 may be associated with non-volatile memory (e.g., NAND memory), and the volatile molded memory assembly 304 may be associated with volatile memory (e.g., DRAM).

As shown in FIG. 3C, the volatile molded memory assembly 304 may include at least one die 328, such as a DRAM die or a similar die. The at least one die 328 may be configured to be electrically coupled to the substrate 308 via multiple wire bonds 330. The volatile molded memory assembly 304 may include a molded casing 331 surrounding the die 328 and/or encapsulating the multiple wire bonds 330. In a similar manner as described above in connection with the molded casing 315 of the non-volatile molded memory assembly 302, the molded casing 331 may include a first mold compound 332 partially surrounding the die 328, and a second mold compound 334 also partially surrounding the die 328 (and, if present, any additional stacked dies 328) and encapsulating the wire bonds 330. In implementations including multiple dies 328, the multiple dies 328 may be coupled and/or adhered to one another, such as via a DAF or similar adhesive provided between each successive die 328.

In some implementations, the volatile molded memory assembly 304 may include multiple metallic (e.g., copper) contacts configured to couple the volatile molded memory assembly 304 to the substrate 308. More particularly, the volatile molded memory assembly 304 may include multiple metallic contacts disposed in the first mold compound 332. For example, the volatile molded memory assembly 304 may include a first subset of contacts 336 in the first mold compound 332 and a second subset of contacts in the first mold compound 332, which are not visible in the view shown in FIG. 3C but which may be substantially aligned with the first subset of contacts 336 and which may be provided near a back, in the y-axis direction, of the volatile molded memory assembly 304. Moreover, in some implementations, some of the contacts may be configured to provide an electrical connection between the volatile molded memory assembly 304 (and, more particularly, the die 328 of the volatile molded memory assembly 304) and the substrate 308, while other ones of the contacts may be electrically isolated from the die 328 and thus may serve to provide only a mechanical connection between the volatile molded memory assembly 304 and the substrate 308. Put another way, in some implementations, the first subset of contacts 336 are configured to provide an electrical connection between the die 328 and the substrate 308 associated with the semiconductor package 300 (e.g., via the multiple wire bonds 330 being electrically coupled to the first subset of contacts 336), and the second subset of contacts may be electrically isolated from the die 328.

In some implementations, the volatile molded memory assembly 304 may be configured to be bonded to the substrate 308 via multiple micro balls (e.g., micro solder balls) or similar bump bonds electrically coupling the contacts 336 to corresponding bond pads, lead fingers, terminals, or similar contacts disposed on a surface of the substrate 308 (which are described in more detail below in connection with FIG. 4F). For example, in the implementation depicted in FIG. 3C, the first subset of contacts 336 may be configured to be coupled to the substrate 308 via a first set of micro balls 338, and the second subset of contacts may be configured to be coupled to the substrate 308 via a second set of micro balls (not shown, but which may be substantially aligned with the first set of micro balls 338 in the y-axis direction). In a similar manner as described above in connection with FIG. 2B, in implementations in which certain contacts do not provide an electrical connection to the die 328 of the volatile molded memory assembly 304, the corresponding micro balls may serve only to mechanically (and not electrically) couple the non-volatile molded memory assembly 302 to the substrate 308. For example, the first set of micro balls 338 may provide a mechanical and electrical connection between the volatile molded memory assembly 304 and the substrate 308, and a second set of micro balls, which may be disposed at electrically isolated second subset of contacts, may be dummy balls that provide only a mechanical connection between the volatile molded memory assembly 304 and the substrate 308. Additionally, or alternatively, and in a similar manner as described above in connection with the non-volatile molded memory assembly 302, in some other implementations additional subsets of micro balls may be provided to provide increased bonding contacts and/or stability.

By employing individually molded memory assemblies 302, 304 in the semiconductor package 300, the individual components may be accessible for testing, replacement, upgrade, or similar purposes. As a result, a yield lost associated with manufacturing the semiconductor package 300 may be reduced as compared to traditional SiP semiconductor device assemblies, because faulty components may be individually tested and/or replaced rather than requiring replacement of an entire semiconductor package. Moreover, because the components may be individually accessible for purposes of testing, replacement, and/or upgrade, the semiconductor package 300 may be suitable for a wide variety of applications and products.

As indicated above, FIGS. 3A-3C are provided as examples. Other examples may differ from what is described with respect to FIGS. 3A-3C.

FIGS. 4A-4F are diagrams of an example process used to fabricate a molded memory assembly for an SiP semiconductor device assembly. More particularly, FIGS. 4A-4F are diagrams of an example process used to fabricate the non-volatile molded memory assembly 302 described above in connection with FIGS. 3A and 3B. Although for ease of discussion only the fabrication process of the non-volatile molded memory assembly 302 is described in detail, a similar process may be used to fabricate other molded die assemblies, such as the volatile molded memory assembly 304 described above in connection with FIG. 3C or a similar molded die assembly. The fabrication process shown and described in connection with FIGS. 4A-4F may be performed using various semiconductor manufacturing equipment, such as the semiconductor manufacturing equipment described below in connection with FIG. 6.

Figure 4A:
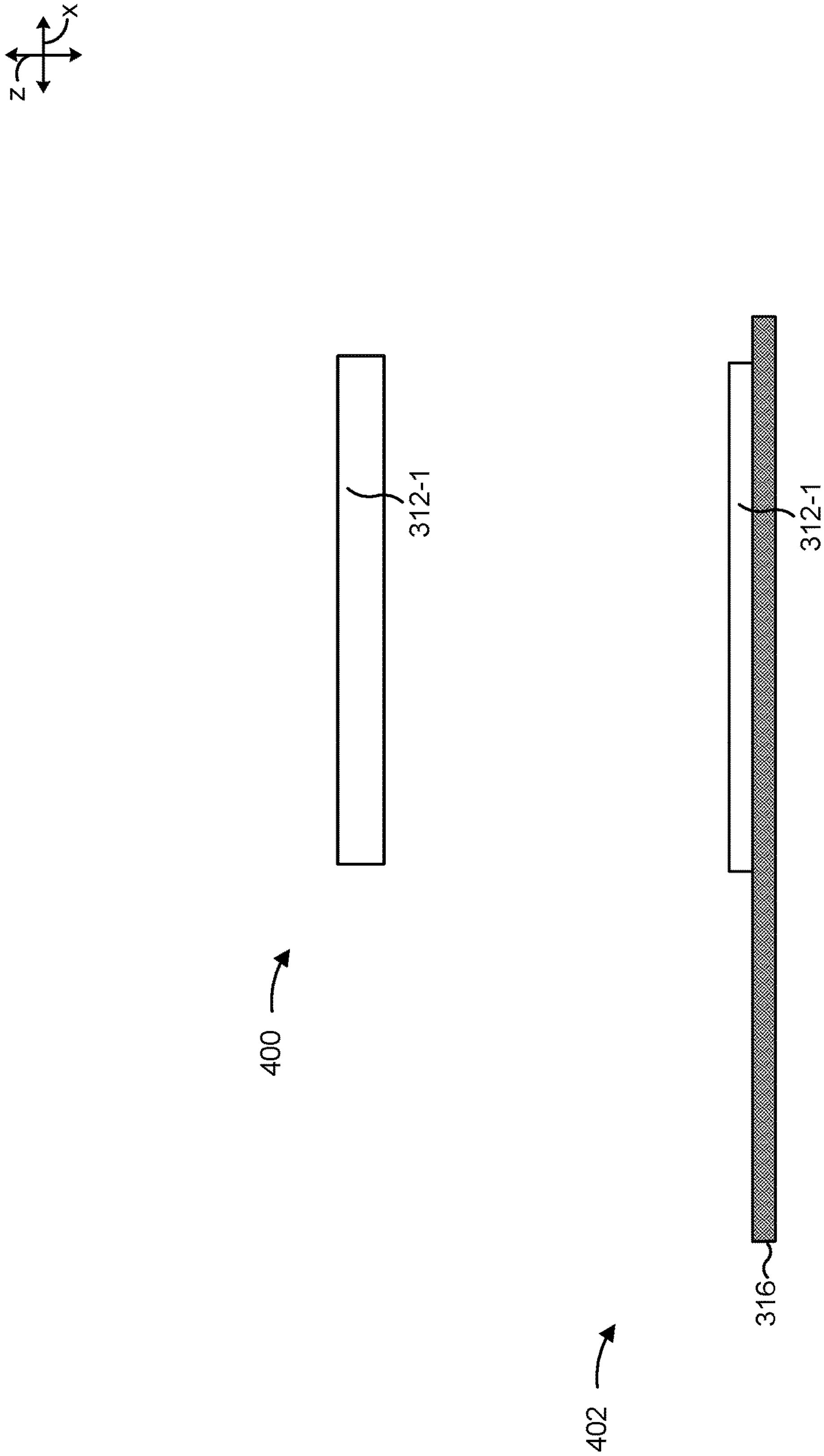
FIGS. 4A-4F are diagrams of an example process used to fabricate a molded memory assembly for an SIP semiconductor device assembly.

As shown in FIG. 4A, and as indicated by reference number 400, the fabrication process may include receiving the first die 312-1, which may be a lowermost die 312 of a die stack (e.g., a NAND stack) associated with the non-volatile molded memory assembly 302. As shown by reference number 402, the fabrication process may include partially surrounding the first die 312-1 with the first mold compound 316. For example, the first die 312-1 may be partially surrounded with the first mold compound 316 using a compression molding process or a similar molding process.

Figure 4B:
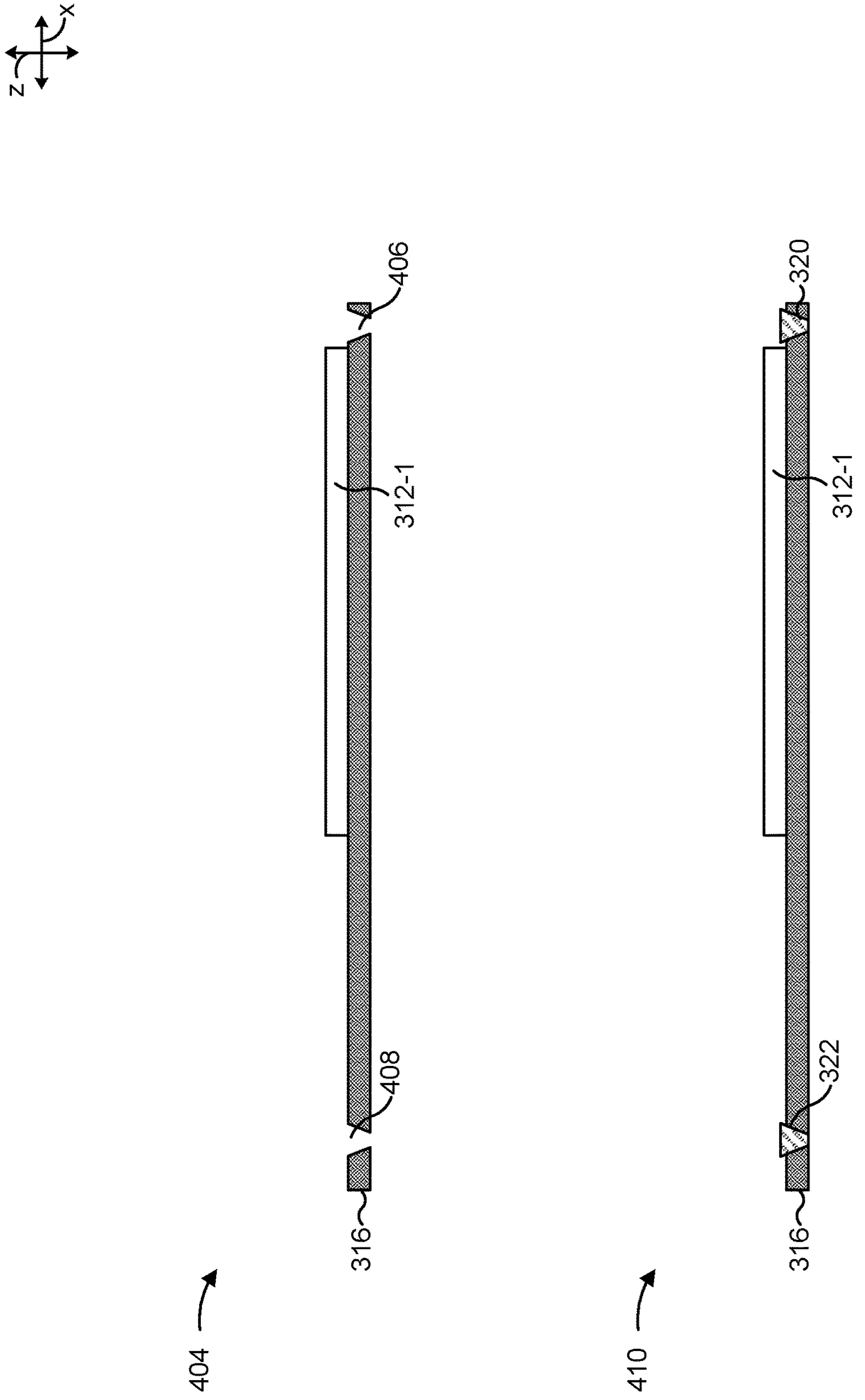

As shown in FIG. 4B, and as indicated by reference number 404, the fabrication process may include forming multiple via holes 406, 408 in the first mold compound 316.

For example, the fabrication process may include forming a first set of via holes 406 corresponding to the first subset of contacts 320, and/or the fabrication process may include forming a second set of via holes 408 corresponding to the second subset of contacts 322. In implementations in which more contacts are implemented, such as a row of contacts provided between, in the x-axis direction, the first subset of contacts 320 and the second subset of contact 322, additional via holes may be formed corresponding to the additional contacts. The via holes 406, 408 may be formed in the first mold compound using any suitable via hole fabrication process, such as by drilling or a similar process. For example, in some implementations, a laser may be used to drill the via holes 406, 408 in the first mold compound 316.

As shown by reference number 410, the fabrication process may include filling the via holes 406, 408 with a conductive material, thereby forming the multiple contacts 320, 322. More particularly, in implementations including the two subsets of contacts 320, 322, the fabrication process may include filling the first set of via holes 406 with a conductive material in order to form the first subset of contacts 320, and the fabrication process may include filling the second set of via holes 408 with a conductive material in order to form the second subset of contacts 322. In some implementations, a conductive material used to form the contacts 320, 322 may be copper, and thus the fabrication process may include filling the via holes 406, 408 with copper to form the multiple contacts 320, 322.

Figure 4C:
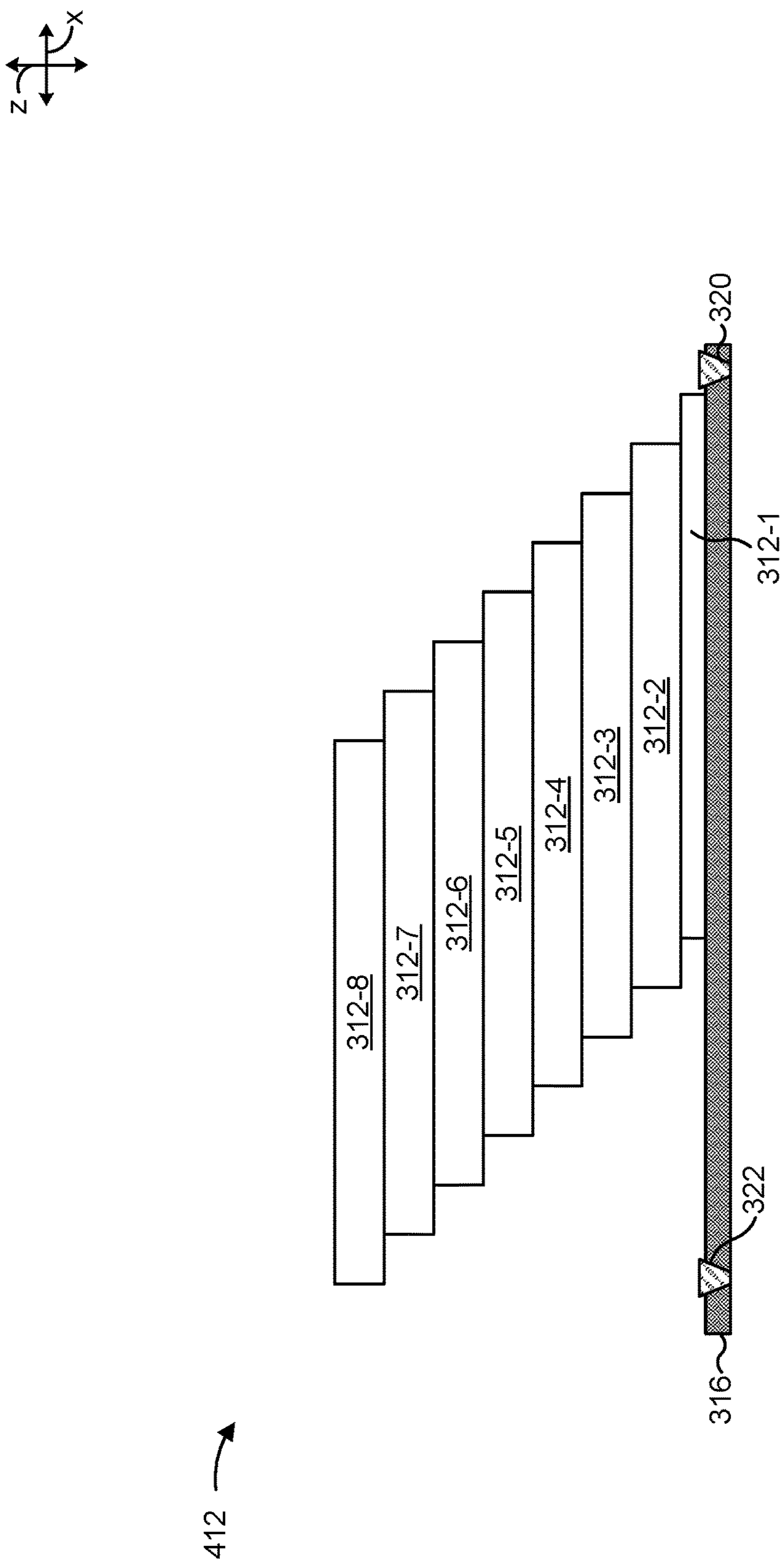

As shown in FIG. 4C, and as indicated by reference number 412, in implementations including multiple stacked dies 312 (e.g., a NAND stack), the fabrication process may include adhering one or more dies 312 to the first die 312-1, thereby forming a die stack. For example, the fabrication process may include adhering the second die 312-2 to the first die 312-1, the third die 312-3 to the second die 312-2, the fourth die 312-4 to the third die 312-3, the fifth die 312-5 to the fourth die 312-4, the sixth die 312-6 to the fifth die 312-5, the seventh die 312-7 to the sixth die 312-6, and the eighth die 312-8 to the seventh die 312-7. In some implementations, adhering two dies 312 to each other may include applying a DAF or a similar adhesive between the two dies 312.

Figure 4D:
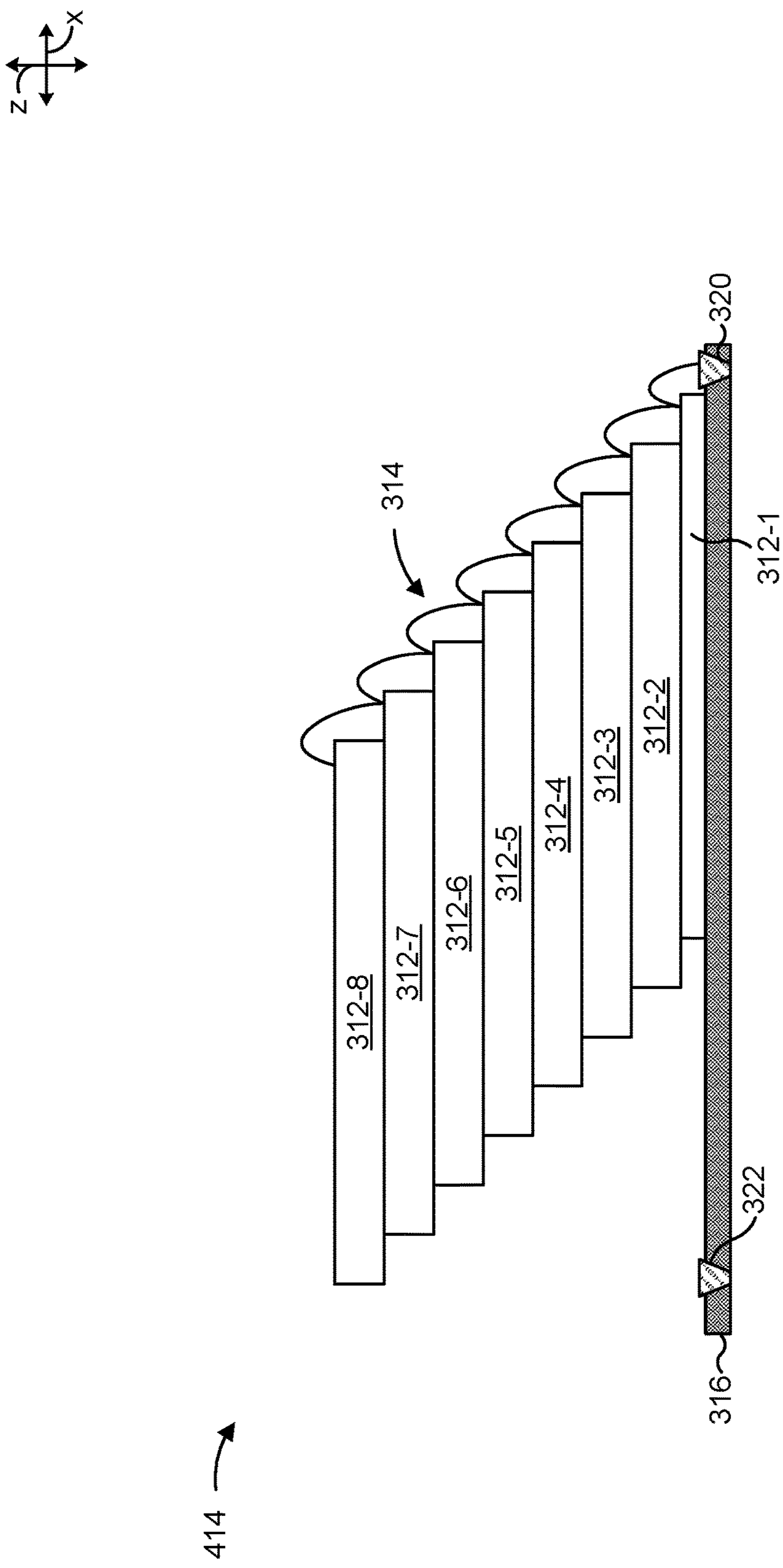

As shown in FIG. 4D, and as indicated by reference number 414, in some implementations the fabrication process may include electrically coupling the dies 312 to one another via the multiple wire bonds 314. More particularly, the fabrication process may include soldering gold wires, copper wires, or similar wires to bond pads or similar electrical contacts associated with each die 312 and/or to the first subset of electrical contacts 320, thereby creating an electrical bond between the dies 312 and/or the first subset of contacts 320. As described above in connection with FIG. 3B, in some implementations, the second subset of contacts 322 may remain electrically isolated from the dies 312. In such implementations, the fabrication process may include refraining from bonding the second subset of contacts 322 to the dies 312, as shown in FIG. 4D.

Figure 4E:
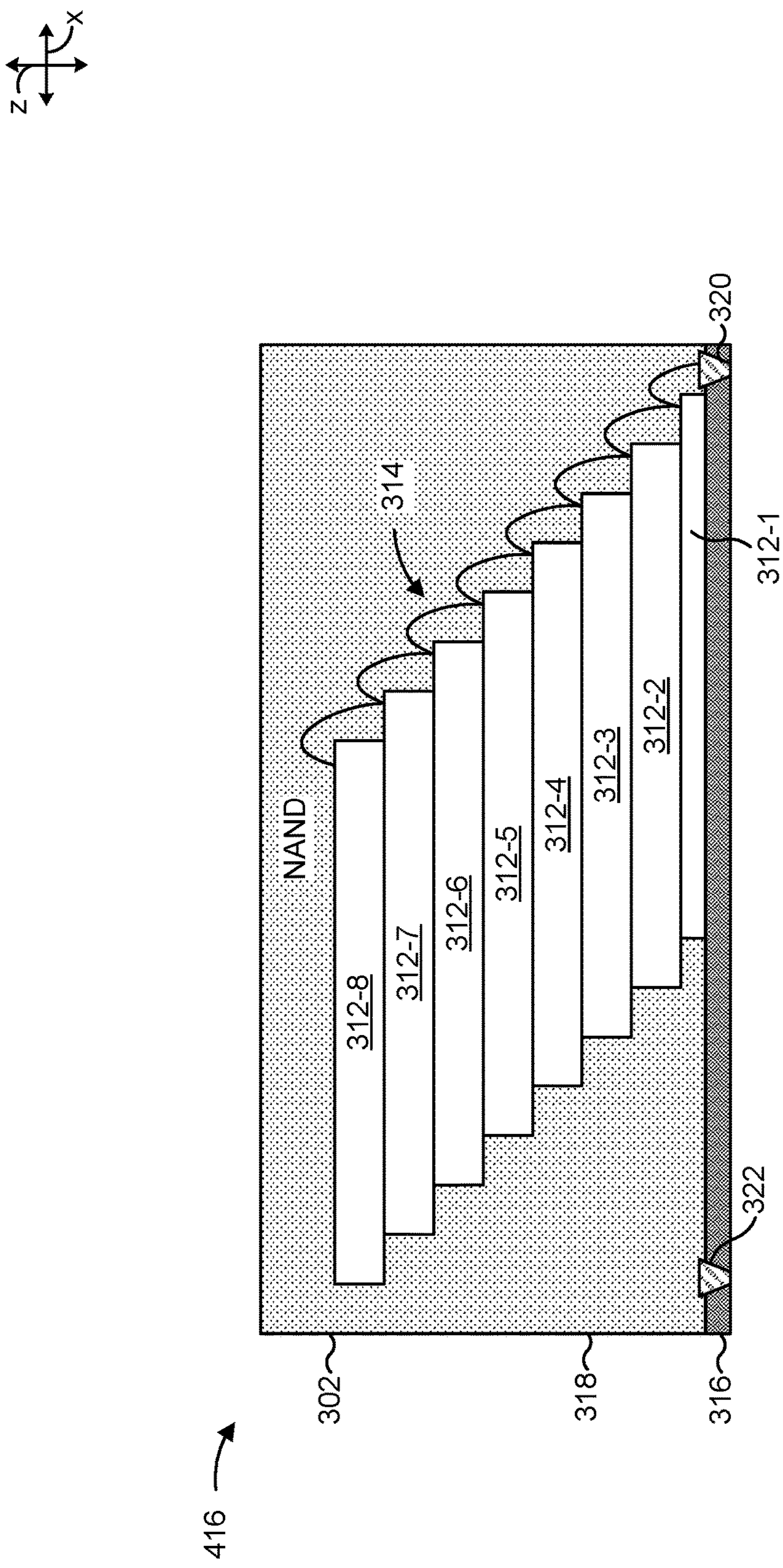

As shown in FIG. 4E, and as indicated by reference number 416, the fabrication process may further include surrounding the die stack (e.g., the multiple dies 312) with the second mold compound 318, thereby encapsulating the plurality of wire bonds 314 in the second mold compound 318 and forming the non-volatile molded memory assembly 302. In this regard, unlike the apparatus 100 described in connection with FIG. 1 in which a mold compound (e.g., casing 120) may be placed over a substrate 110 to thereby encapsulate the integrated circuits 105, in this implementation the second molded layer 318 is formed on the first molded layer 116 to encapsulate the dies 312. Thus, the process used to form the non-volatile molded memory assembly 302 (and thus process parameters used for forming the non-volatile molded memory assembly 302) may differ compared to a process and/or process parameters used to form the apparatus 100. Moreover, in some implementations, multiple non-volatile molded memory assemblies 302 may be configured to stack on top of each other in the z-axis direction. In such implementations, the fabrication process may include forming other features in the non-volatile molded memory assembly 302 to thereby enable an electrical connection between a stacked molded memory assembly and the substrate 308. For example, the fabrication process may include forming a through mold via (TMV) in the second mold compound 318 that is configured to electrically couple another molded memory assembly to the substrate. Details of stacking multiple molded memory assemblies and/or forming a TMV in a molded memory assembly is described in more detail below in connection with FIG. 5.

Figure 4F:
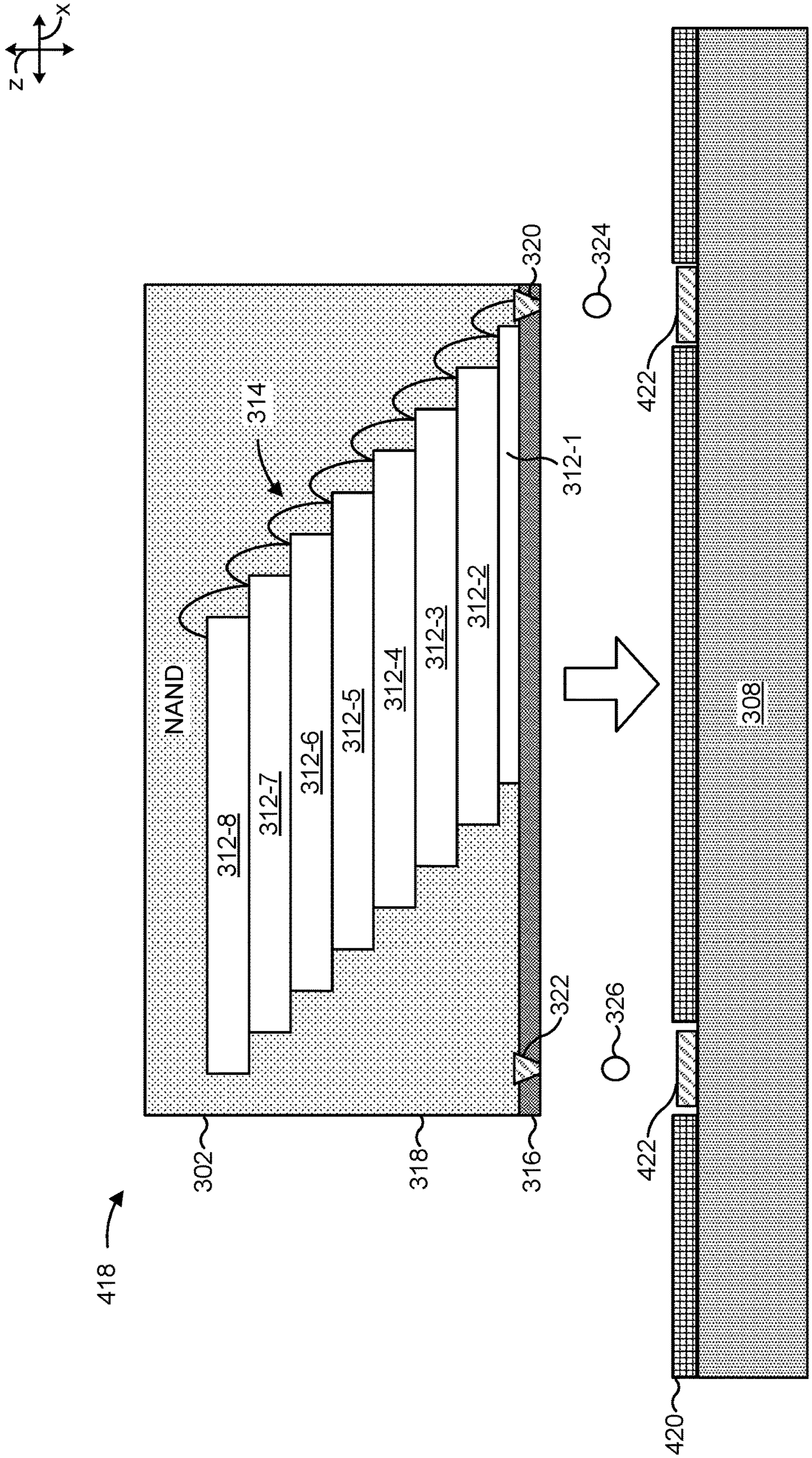

As shown in FIG. 4F, and as indicated by reference number 418, the fabrication process may further include coupling the non-volatile molded memory assembly 302 to the substrate 308 associated with the semiconductor package 300 via the micro balls 324, 326. For example, the substrate 308 may include a solder mask 420 (sometimes called a solder resist) surrounding multiple bond pads 422 or similar contacts, such as lead fingers, terminals, or similar components. During attachment of the non-volatile molded memory assembly 302 to the substrate 308, each bond pad 422 may be aligned with a corresponding contact 320, 322, with a micro ball 324, 326 being provided between each bond pad 422 and a corresponding contact 320, 322. Moreover, the micro balls 324, 326 may be heated to a reflow temperature, such as via a solder reflow process or the like, to melt the micro balls 324, 326 and thus form a bump bond between each bond pad 422 and a corresponding contact 320, 322. For example, a first subset of bump bonds may be formed by the set micro balls 324 included between the first subset of contacts 320 and a first subset of the bond pads 422, and a second set of bump bonds may be formed by the set of micro balls 326 included between the second subset of contacts 322 and a second subset of the bond pads 422. As described above in connection with FIG. 3B, the micro balls 324 may be configured to provide a mechanical and electrical connection between the non-volatile molded memory assembly 302 and the substrate 308, while the micro balls 326 may be dummy balls configured to provide only a mechanical connection between the non-volatile molded memory assembly 302 and the substrate 308. Put another way, in some implementations, coupling the non-volatile molded memory assembly 302 to the substrate 308 via the micro balls 324, 326 includes forming an electrical connection between the memory die stack (e.g., the dies 312) and the substrate 308 via the first set of micro balls 324, and electrically isolating the memory die stack from the second set of micro balls 326.

In some implementations, a filler material may be provided between the non-volatile molded memory assembly 302 and the substrate 308. For example, a moldable underfill (MUF) material, a capillary underfill material, or a similar filler material may be provided between the non-volatile molded memory assembly 302 and the substrate 308. In such implementations, the filler material may encapsulate the micro balls 324, 326 to thereby protect the micro balls 324, 326 from wear and/or corrosion, and/or the filler material may improve a mechanical bond between the non-volatile molded memory assembly 302 and the substrate 308.

Although not shown in FIGS. 4A-4F, in some aspects the fabrication process may further include coupling additional molded memory assemblies, the controller 306, a capacitor, a resistor, or a similar electronic component to the substrate 308. For example, in addition to attaching one or more non-volatile molded memory assemblies 302 to the substrate 308, which may be associated with a NAND memory or a similar non-volatile memory, the fabrication process may include coupling the second molded memory assembly 304 to the substrate 308, which may be associated with DRAM or a similar volatile memory. In such implementations, the volatile molded memory assembly 304 may be coupled to the substrate 308 in a substantially similar manner as described above in connection with FIG. 4F (e.g., by using a solder reflow process to solder the multiple contacts 336 of the volatile molded memory assembly 304 to bond pads 422 of the substrate 308 via multiple micro balls 338). In such implementations, each molded memory assembly 302, 304 and/or any additional electronic components attached to the substrate 308 (e.g., the controller 306, a capacitor, a resistor, or a similar component) may be individually accessible such as for purposes of testing, upgrading, and/or replacement, thereby reducing yield loss and improving the flexibility of the semiconductor package 300 for use in various applications.

Although the implementations described above in connection with FIGS. 3A-4F are described in connection with a semiconductor package 300 in which the various molded memory assemblies 302, 304 are horizontally arranged on the substrate 308 (e.g., disposed proximate to one another in the x-axis direction and/or y-axis direction), in some other implementations the molded memory assemblies 302, 304 may be vertically arranged (e.g., stacked in the z-axis direction). Aspects of vertically arranged molded memory assemblies 302, 304 are described in more detail below in connection with FIG. 5.

As indicated above, FIGS. 4A-4F are provided as an example. Other examples may differ from what is described with respect to FIGS. 4A-4F.

Figure 5:
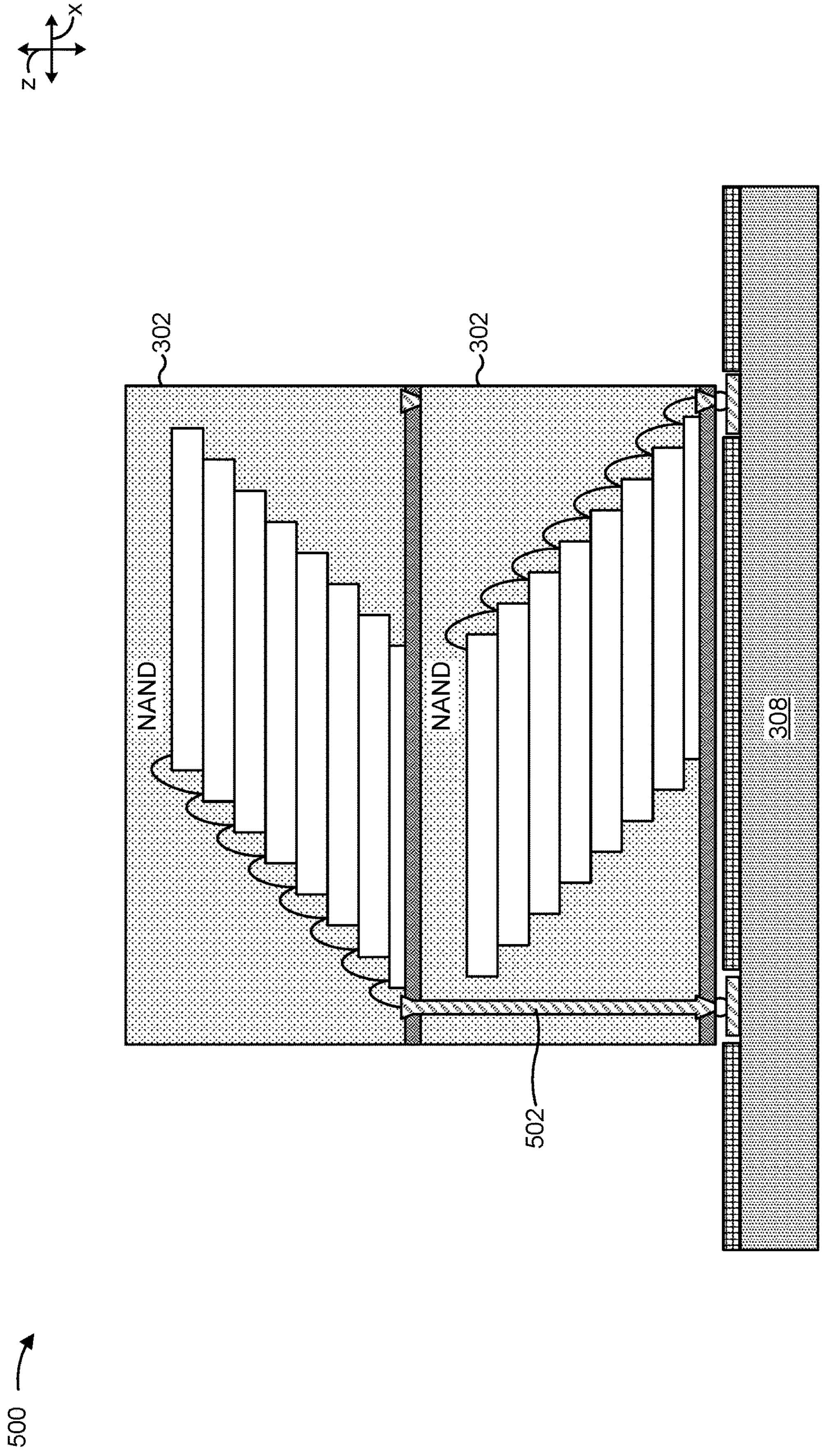
FIG. 5 is a diagram of an example apparatus that includes two stacked molded memory assemblies.

FIG. 5 is a diagram of an example apparatus 500 that includes two stacked molded memory assemblies. More particularly, the example apparatus 500 may include two non-volatile molded memory assemblies 302 arranged in the z-axis direction, such that a first non-volatile molded memory assembly 302 (e.g., a lowermost, in the z-axis direction, non-volatile molded memory assembly 302) is directly coupled to the substrate 308, and such that a second non-volatile molded memory assembly 302 (e.g., an uppermost, in the z-axis direction, non-volatile molded memory assembly 302) is disposed above, in the z-axis direction, the first non-volatile molded memory assembly 302 and attached thereto. In some other implementations, other molded memory assemblies (e.g., multiple ones of the volatile molded memory assembly 304) may be arranged in a similar manner.

In such implementations, the uppermost molded memory assembly (e.g., the second non-volatile molded memory assembly 302 in the example shown in FIG. 5) may be electrically coupled to the substrate 308 by a TMV 502 provided in the molded casing of the lowermost molded memory assembly (e.g., the first non-volatile molded memory assembly 302 in the example shown in FIG. 5). More particularly, during the fabrication process of the non-volatile molded memory assembly 302, the TMV 502 (e.g., a copper pillar or a similar TMV) may be coupled to a contact, such as one of the second subset of contacts 322, and encapsulated in the second molding compound 318.

The second non-volatile molded memory assembly 302 may then be adhered to the first non-volatile molded memory assembly 302, such as via a DAF or similar adhesive, and electrically coupled to the substrate 308 via the TMV 502. More particularly, one or more contacts (e.g., one or more of the first subset of contacts 320) of the second non-volatile molded memory assembly 302 may be soldered or otherwise bonded to the TMV 502, which in turn may electrically couple the die stack of the second non-volatile molded memory assembly 302 to the substrate 308. In this way, multiple of the molded memory assemblies 302, 304 described herein may be employed in semiconductor packages having little available real estate, thereby increasing the storage capacity of the semiconductor package, among other performance benefits.

As indicated above, FIG. 5 is provided as an example. Other examples may differ from what is described with respect to FIG. 5.

Figure 6:
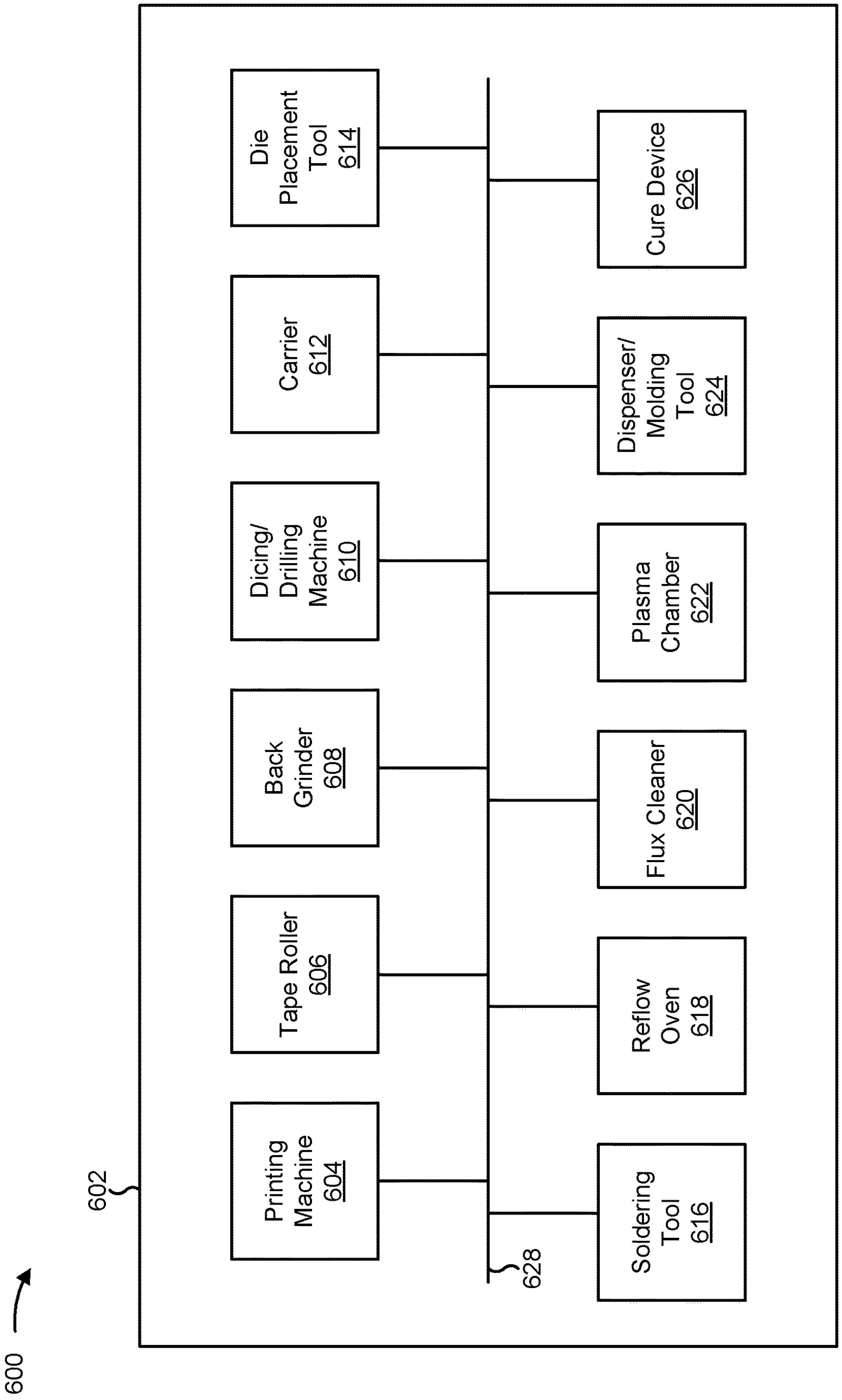
FIG. 6 is a diagram of example equipment used to manufacture various semiconductor packages, memory devices, or similar components described herein.

FIG. 6 is a diagram of example equipment 600 used to manufacture various semiconductor packages, memory devices, or similar components described herein. In some implementations, the equipment 600 may be used to manufacture the semiconductor package 300 and/or components thereof (e.g., the non-volatile molded memory assembly 302, the volatile molded memory assembly 304, or another component of the semiconductor package 300). As shown in FIG. 6, the equipment 600 may include a packaging system 602. The packaging system 602 may include one or more devices or tooling, such as a printing machine 604, a tape roller 606, a back grinder 608, a dicing and/or drilling machine 610, a carrier 612, a die placement tool 614, a soldering tool 616, a reflow oven 618, a flux cleaner 620, a plasma chamber 622, a dispenser and/or molding tool 624, and/or a cure device 626. One or more devices may be may physically or communicatively coupled to one another. For example, one or more devices may interconnect via wired connections and/or wireless connections, such as via a bus 628. Additionally, or alternatively, one or more devices may form part of an electronics assembly manufacturing line.

The printing machine 604 may be a device capable of printing patterns in a material such as silicon, a dielectric material, a polyimide layer, or a similar material, for purposes of forming an integrated circuit or the like. In some implementations, the printing machine 604 may be a lithography device capable of printing patterns in a material to form an integrated circuit.

The tape roller 606 may be a device capable of laminating a tape (e.g., a back grinding tape) on a semiconductor wafer and/or a semiconductor die. The tape roller 606 may be capable of applying pressure to a tape as the tape is being laminated onto a wafer or a die.

The back grinder 608 may be a device capable of grinding a backside of a semiconductor wafer and/or a semiconductor die, thereby reducing a thickness of the wafer and/or a die to a desired thickness. In some implementations, the back grinder 608 may be associated with a rotary table, a chuck table, and/or a grinding wheel for purposes of grinding a wafer and/or a die to a suitable thickness.

The dicing and/or drilling machine 610 may be a device capable of dicing a die, such as a microcontroller, a memory die, or other semiconductor die, from a wafer.

In some implementations, the dicing and/or drilling machine 610 may include one or more blades and/or one or more lasers to dice a die from the wafer. In some implementations, the dicing and/or drilling machine 610 may be a device capable of drilling through vias in a mold compound. For example, the dicing and/or drilling machine 610 may include a laser capable of drilling through vias in a mold compound.

The carrier 612 may be a device capable of supporting and/or carrying a substrate during a die and/or chip attachment process, during a compression molding process, or during a similar process. The carrier 612 may be constructed from a non-contaminating material, such as quartz, glass, or a similar material, and may be capable of withstanding high temperatures. In that regard, the carrier 612 may be capable of carrying a substrate and/or one or more die through one or more ovens, such as a reflow oven 618 and/or a cure device 626.

The die placement tool 614 may be a high-precision tool capable of placing a die onto a substrate. In some implementations, the die placement tool 614 may be capable of flipping a flip chip die during a placement process, such that an active surface of the flip chip die, which may be facing up during preliminary manufacturing steps, may face the substrate during the flip chip die placement process. In some implementations, the die placement tool 614 may include one or more sensors capable of aligning bump bonds on a die with bond pads on a substrate during a flip chip die attachment process.

The soldering tool 616 may be capable of forming one or more solder connections between components of a semiconductor package. For example, the soldering tool 616 may be capable of forming wire bond connections between components of a semiconductor package by soldering wires connecting wire bond bands from one component to wire bond pads of another component. In some examples, the soldering tool 616 may be capable of applying a solder paste to between electrical contacts of electronic components, such as between pillar interconnects provided on a load switch and corresponding electrical contacts provided on a substrate. Additionally, or alternatively, the soldering tool 616 may be capable of applying solder or other electrically conductive material to form a portion of an electrical connection to be formed between a die and a substrate. For example, the soldering tool 616 may be capable of applying a grid of solder bumps (e.g., micro balls) to a die and/or a molded die assembly, which will align with a grid of bump pads on a substrate during a flip chip attachment process, or the like The reflow oven 618 may be a device capable of heating components to a suitable temperature to cause a reflow of solder or other bonding material, thereby causing the solder or similar material to melt and make an electrical connection between two components.

The flux cleaner 620 may be a device capable of removing residual flux from a soldering process. In some implementations, the flux cleaner 620 may include a heater capable of removing residual flux through a heat treatment process. Additionally, or alternatively, the flux cleaner 620 may include a nozzle or similar device capable of applying a cleaning agent to a component in order to remove residual flux therefrom.

The plasma chamber 622 may be a device capable of providing plasma treatment to component. In some implementations, the plasma chamber 622 may be capable of directly or indirectly applying a plasma stream to an area of a component, such as for purposes of preparing the area on the component for receiving an epoxy underfill, or the like.

The dispenser and/or molding tool 624 may be a device capable of dispensing a filler material around a die or similar component. In some implementations, the dispenser and/or molding tool 624 may be capable of dispensing a mold compound (e.g., an epoxy mold compound) during a compression molding process. In some implementations, the dispenser and/or molding tool 624 may include a dispensing needle capable of applying an epoxy underfill by capillary action under pressure, such as by dispensing underfill material around a periphery of a die and/or other electrical component such that the underfill material flows beneath the die and/or other electrical component and fills a space between the die and/or other electrical component and a substrate.

The cure device 626 may be a device capable of curing a material, such as an ultraviolet (UV) curable adhesive layer, a mold compound, such as an epoxy mold compound, an epoxy underfill material, a moldable underfill material, or a similar material. In some implementations, the cure device 626 may include a UV lamp capable of irradiating a back grinding tape with UV light in order to cure an adhesive layer thereof. In some implementations, the cure device 626 may be an oven configured to heat a mold compound to a suitable curing temperature. Additionally, or alternatively, the cure device 626 may be capable of curing a mold compound via a chemical reaction, by the application of ultraviolet light, by the application of other radiation, or the like.

The number and arrangement of devices and networks shown in FIG. 6 are provided as an example. In practice, there may be additional devices, fewer devices, different devices, or differently arranged devices than those shown in FIG. 6. Furthermore, two or more devices shown in FIG. 6 may be implemented within a single device, or a single device shown in FIG. 6 may be implemented as multiple, distributed devices. Additionally, or alternatively, a set of devices (e.g., one or more devices) of equipment 600 may perform one or more functions described as being performed by another set of devices of equipment 600.

Figure 7:
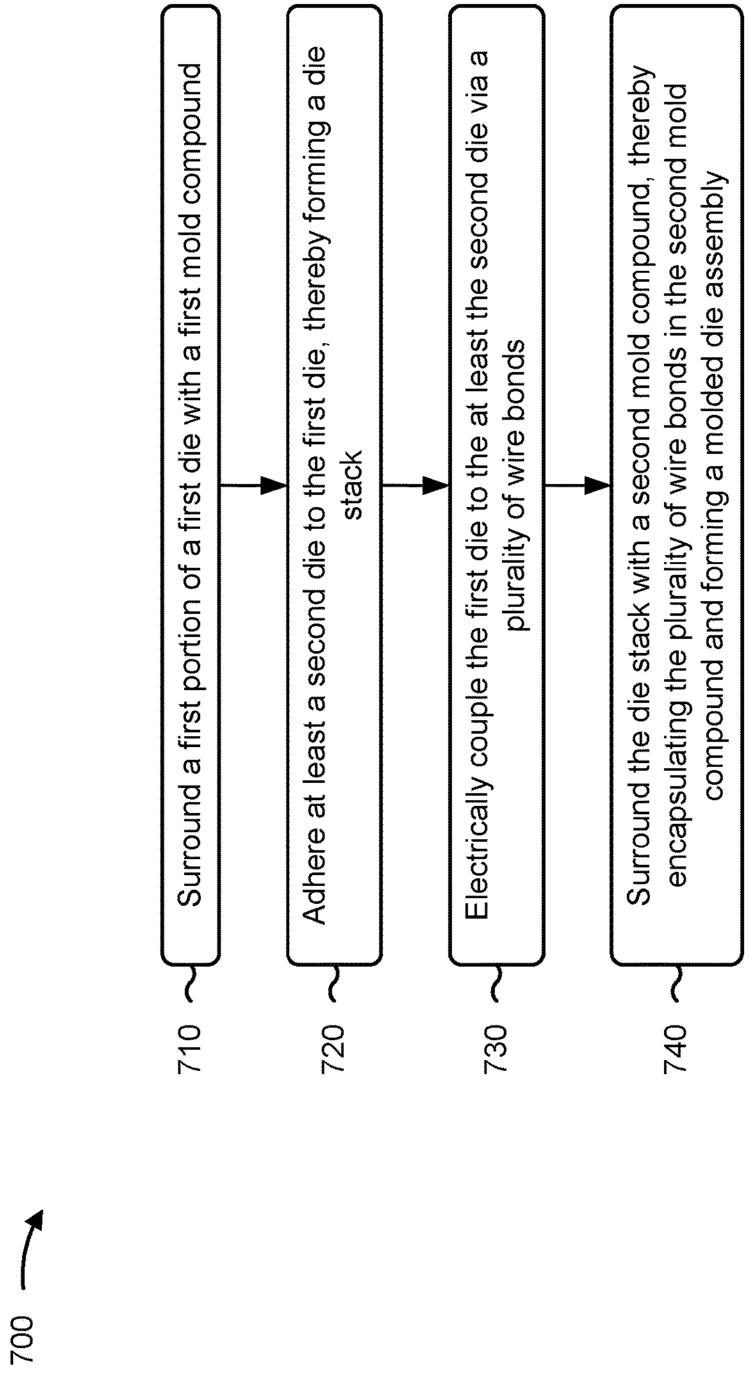
FIG. 7 is a flowchart of an example method of forming a molded die assembly.

FIG. 7 is a flowchart of an example method 700 of forming a molded die assembly. In some implementations, one or more process blocks of FIG. 7 may be performed by various semiconductor manufacturing equipment, such as the semiconductor manufacturing equipment described above in connection with FIG. 6.

As shown in FIG. 7, the method 700 may include surrounding a first portion of a first die with a first mold compound (block 710). As further shown in FIG. 7, the method 700 may include adhering at least a second die to the first die, thereby forming a die stack (block 720). As further shown in FIG. 7, the method 700 may include electrically coupling the first die to the at least the second die via a plurality of wire bonds (block 730). As further shown in FIG. 7, the method 700 may include surrounding the die stack with a second mold compound, thereby encapsulating the plurality of wire bonds in the second mold compound and forming a molded die assembly (block 740).

The method 700 may include additional aspects, such as any single aspect or any combination of aspects described below and/or in connection with one or more other methods described elsewhere herein.

In a first aspect, the method 700 includes forming a plurality of via holes in the first mold compound, and filling the plurality of via holes with a conductive material, thereby forming a plurality of contacts.

In a second aspect, alone or in combination with the first aspect, the method 700 includes electrically coupling the die stack to a subset of the plurality of contacts via the plurality of wire bonds.

In a third aspect, alone or in combination with one or more of the first and second aspects, the method 700 includes forming a through mold via in the second mold compound, and electrically coupling the through mold via to a contact, of the plurality of contacts.

In a fourth aspect, alone or in combination with one or more of the first through third aspects, the method 700 includes adhering another molded die assembly to the molded die assembly, and electrically coupling the other molded die assembly to the through mold via.

In a fifth aspect, alone or in combination with one or more of the first through fourth aspects, the method 700 includes coupling the molded die assembly to a substrate associated with a system in package via a plurality of micro balls.

In a sixth aspect, alone or in combination with one or more of the first through fifth aspects, coupling the molded die assembly to the substrate associated with the system in package via the plurality of micro balls includes forming an electrical connection between the die stack and the substrate via a first subset of the plurality of micro balls, and electrically isolating the die stack from a second subset of the plurality of micro balls.

In a seventh aspect, alone or in combination with one or more of the first through sixth aspects, the method 700 includes coupling another molded die assembly to the substrate associated with the system in package.

Although FIG. 7 shows example blocks of the method 700, in some implementations, the method 700 may include additional blocks, fewer blocks, different blocks, or differently arranged blocks than those depicted in FIG. 7. In some implementations, the method 700 may include forming the semiconductor package 300, an integrated assembly that includes the semiconductor package 300, any part described herein of the semiconductor package 300, and/or any part described herein of an integrated assembly that includes the semiconductor package 300. For example, the method 700 may include forming one or more of the parts 302-338, 406-408, 420-422, and/or 502.

Figure 8:
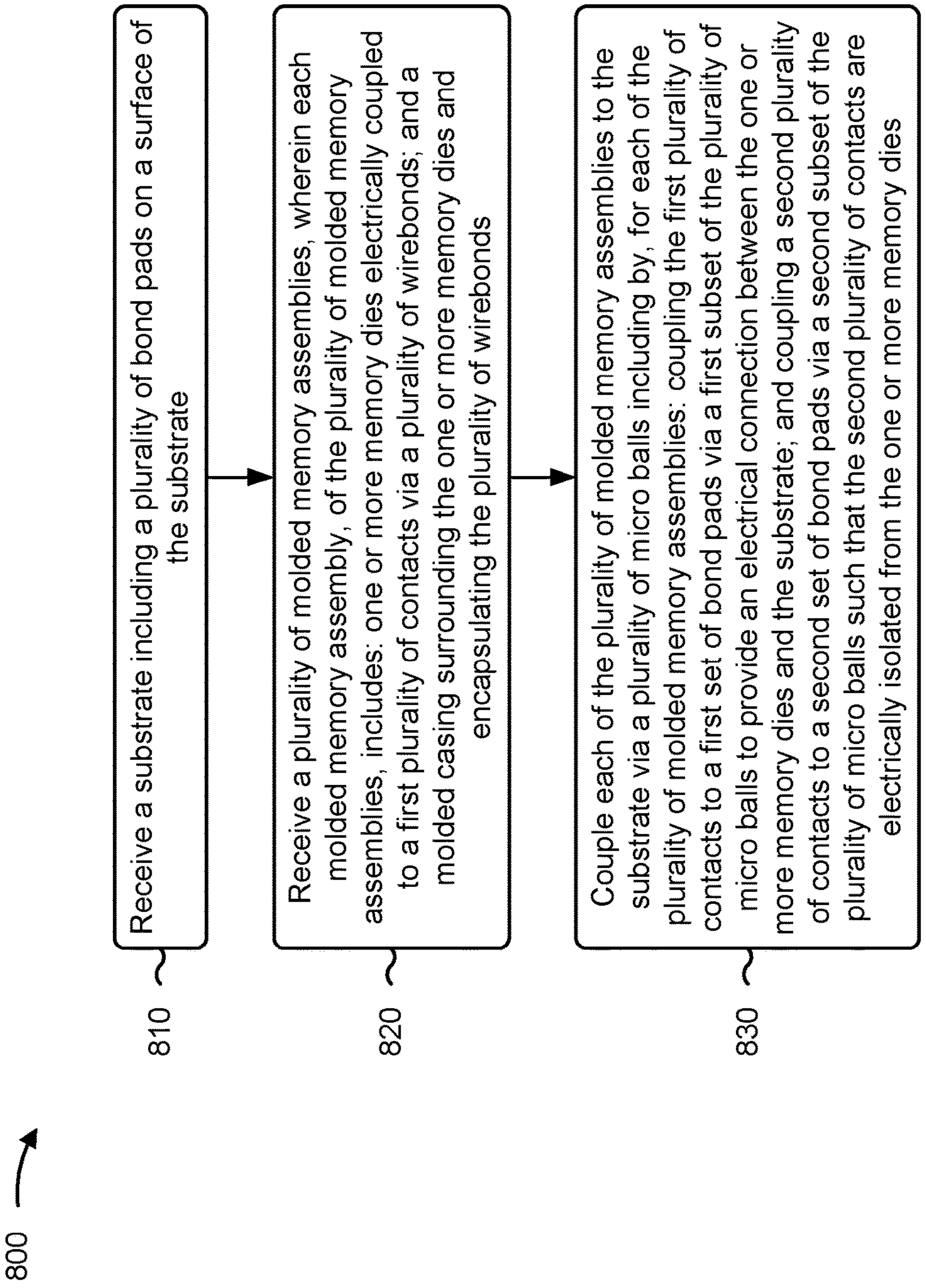
FIG. 8 is a flowchart of an example method of forming an integrated assembly or memory device having a molded memory assembly.

FIG. 8 is a flowchart of an example method 800 of forming an integrated assembly or memory device having a molded memory assembly. In some implementations, one or more process blocks of FIG. 8 may be performed by various semiconductor manufacturing equipment, such as the semiconductor manufacturing equipment described above in connection with FIG. 6.

As shown in FIG. 8, the method 800 may include receiving a substrate including a plurality of bond pads on a surface of the substrate (block 810). As further shown in FIG. 8, the method 800 may include receiving a plurality of molded memory assemblies, wherein each molded memory assembly, of the plurality of molded memory assemblies, includes: one or more memory dies electrically coupled to a first plurality of contacts via a plurality of wire bonds; and a molded casing surrounding the one or more memory dies and encapsulating the plurality of wire bonds (block 820). As further shown in FIG. 8, the method 800 may include coupling each of the plurality of molded memory assemblies to the substrate via a plurality of micro balls including by, for each of the plurality of molded memory assemblies: coupling the first plurality of contacts to a first set of bond pads via a first subset of the plurality of micro balls to provide an electrical connection between the one or more memory dies and the substrate; and coupling a second plurality of contacts to a second set of bond pads via a second subset of the plurality of micro balls such that the second plurality of contacts are electrically isolated from the one or more memory dies (block 830).

The method 800 may include additional aspects, such as any single aspect or any combination of aspects described below and/or in connection with one or more other methods described elsewhere herein.

Although FIG. 8 shows example blocks of the method 800, in some implementations, the method 800 may include additional blocks, fewer blocks, different blocks, or differently arranged blocks than those depicted in FIG. 8. In some implementations, the method 800 may include forming the semiconductor package 300, an integrated assembly that includes the semiconductor package 300, any part described herein of the semiconductor package 300, and/or any part described herein of an integrated assembly that includes the semiconductor package 300. For example, the method 800 may include forming one or more of the parts 302-338, 406-408, 420-422, and/or 502.

In some implementations, a semiconductor device assembly includes a substrate; a molded memory assembly electrically coupled to the substrate, the molded memory assembly including: a plurality of stacked memory dies electrically coupled to the substrate via a plurality of wire bonds; and a molded casing surrounding the plurality of stacked memory dies and encapsulating the plurality of wire bonds.

In some implementations, a molded memory device includes a plurality of stacked NAND dies electrically coupled to one another via a plurality of wire bonds; a molded casing surrounding the plurality of stacked NAND dies and encapsulating the plurality of wire bonds, the molded casing including a first mold partially surrounding a first NAND die, of the plurality of stacked NAND dies, and a second mold partially surrounding the first NAND die, of the plurality of stacked NAND dies, and each additional NAND die, of the plurality of stacked NAND dies; and a plurality of copper contacts configured to couple the molded memory device to a substrate associated with a system in package, the plurality of copper contacts being disposed in the first mold.

In some implementations, a method includes partially surrounding a first memory die with a first mold compound; adhering at least a second memory die to the first memory die, thereby forming a memory die stack; electrically coupling the first memory die to the at least the second memory die via a plurality of wire bonds; and surrounding the memory die stack with a second mold compound, thereby encapsulating the plurality of wire bonds in the second mold compound and forming a molded memory assembly.

In some implementations, a method comprising: receiving a substrate including a plurality of bond pads on a surface of the substrate; receiving a plurality of molded memory assemblies, wherein each molded memory assembly, of the plurality of molded memory assemblies, includes: one or more memory dies electrically coupled to a first plurality of contacts via a plurality of wire bonds; and a molded casing surrounding the one or more memory dies and encapsulating the plurality of wire bonds; coupling each of the plurality of molded memory assemblies to the substrate via a plurality of micro balls including by, for each of the plurality of molded memory assemblies: coupling the first plurality of contacts to a first set of bond pads via a first subset of the plurality of micro balls to provide an electrical connection between the one or more memory dies and the substrate; and coupling a second plurality of contacts to a second set of bond pads via a second subset of the plurality of micro balls such that the second plurality of contacts are electrically isolated from the one or more memory dies.

The foregoing disclosure provides illustration and description but is not intended to be exhaustive or to limit the implementations to the precise forms disclosed.

Modifications and variations may be made in light of the above disclosure or may be acquired from practice of the implementations described herein.

The orientations of the various elements in the figures are shown as examples, and the illustrated examples may be rotated relative to the depicted orientations. The descriptions provided herein, and the claims that follow, pertain to any structures that have the described relationships between various features, regardless of whether the structures are in the particular orientation of the drawings, or are rotated relative to such orientation. Similarly, spatially relative terms, such as “below,” “beneath,” “lower,” “above,” “upper,” “middle,” “left,” and “right,” are used herein for ease of description to describe one element’s relationship to one or more other elements as illustrated in the figures. The spatially relative terms are intended to encompass different orientations of the element, structure, and/or assembly in use or operation in addition to the orientations depicted in the figures. A structure and/or assembly may be otherwise oriented (rotated 90 degrees or at other orientations), and the spatially relative descriptors used herein may be interpreted accordingly. Furthermore, the cross-sectional views in the figures only show features within the planes of the cross-sections, and do not show materials behind the planes of the cross-sections, unless indicated otherwise, in order to simplify the drawings. As used herein, the terms “substantially” and “approximately” mean “within reasonable tolerances of manufacturing and measurement.”

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to “at least one of” a list of items refers to any combination of those items, including single members. As an example, “at least one of: a, b, or c” is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles “a” and “an” are intended to include one or more items and may be used interchangeably with “one or more.” Further, as used herein, the article “the” is intended to include one or more items referenced in connection with the article “the” and may be used interchangeably with “the one or more.” Where only one item is intended, the phrase “only one,” “single,” or similar language is used. Also, as used herein, the terms “has,” “have,” “having,” or the like are intended to be open-ended terms that do not limit an element that they modify (e.g., an element “having” A may also have B). Further, the phrase “based on” is intended to mean “based, at least in part, on” unless explicitly stated otherwise. As used herein, the term “multiple” can be replaced with “a plurality of” and vice versa. Also, as used herein, the term “or” is intended to be inclusive when used in a series and may be used interchangeably with “and/or,” unless explicitly stated otherwise (e.g., if used in combination with “either” or “only one of”).

What is claimed is:

1. A semiconductor device assembly, comprising:

a substrate;

a molded die assembly electrically coupled to the substrate, the molded die assembly including:

a plurality of stacked dies electrically coupled to the substrate via a plurality of wire bonds, wherein the plurality of stacked dies comprises a first die; and a molded casing surrounding the plurality of stacked dies and encapsulating the plurality of wire bonds, wherein the molded casing includes a first molded layer and a second molded layer, wherein the first molded layer surrounds a first portion of the first die, and wherein the second molded layer is disposed above the first molded layer and surrounds the plurality of stacked dies.

2. The semiconductor device assembly of claim 1, wherein the first molded layer is a thin molded layer, wherein the second molded layer is a thick molded layer that substantially encompasses a thickness of the molded die assembly, wherein the first molded layer includes a plurality of interconnections extending from an upper surface of the first molded layer to a lower surface of the first molded layer, and wherein the second molded layer embeds the plurality of wire bonds within the second molded layer.

3. The semiconductor device assembly of claim 2, wherein the plurality of interconnections include a plurality of contacts disposed in the first molded layer, wherein a first subset of the plurality of contacts form an electrical connection with one or more wire bonds, of the plurality of wire bonds, and wherein a second subset of the plurality of contacts are electrically isolated from the plurality of wire bonds.

4. The semiconductor device assembly of claim 1, further comprising another molded die assembly electrically coupled to the substrate, the other molded die assembly including:

at least one other die electrically coupled to the substrate via another plurality of wire bonds; and another molded casing surrounding the at least one other die and encapsulating the other plurality of wire bonds, wherein the other molded casing includes another first molded layer and another second molded layer, wherein the other first molded layer surrounds another lowermost die of the at least one other die, and wherein the second molded layer is disposed above the first molded layer.

5. The semiconductor device assembly of claim 1, wherein the molded die assembly is coupled to the substrate via a plurality of micro balls, wherein a first subset of the plurality of micro balls provide an electrical connection between the molded die assembly and the substrate, and wherein a second subset of the plurality of micro balls do not provide an electrical connection between the molded die assembly and the substrate.

6. The semiconductor device assembly of claim 1, further comprising another molded die assembly electrically coupled to the substrate, wherein the substrate is disposed below the molded die assembly, and wherein the other molded die assembly is disposed above the molded die assembly.

7. The semiconductor device assembly of claim 6, wherein the other molded die assembly is electrically coupled to the substrate by a through mold via provided in the molded casing of the molded die assembly.

8. The semiconductor device assembly of claim 1, wherein at least one of:

the first molded layer exhibits a higher modulus of elasticity than the second molded layer, the first molded layer exhibits a higher coefficient of thermal expansion than the second molded layer, or the first molded layer exhibits a lower thermal conductivity than the second molded layer.

9. A molded memory device, comprising:

a plurality of stacked NAND dies electrically coupled to one another via a plurality of wire bonds;

a molded casing surrounding the plurality of stacked NAND dies and encapsulating the plurality of wire bonds, the molded casing including a first mold surrounding a first portion of a first NAND die, of the plurality of stacked NAND dies, and a second mold surrounding a second portion of the first NAND die and each additional NAND die, of the plurality of stacked NAND dies; and a plurality of copper contacts configured to couple the molded memory device to a substrate associated with a system in package, the plurality of copper contacts being disposed in the first mold.

10. The molded memory device of claim 9, wherein the first NAND die is a lowermost NAND die, of the plurality of stacked NAND dies, and wherein the second mold is disposed above the first mold.

11. The molded memory device of claim 9, wherein a first subset of the plurality of copper contacts are configured to provide an electrical connection between the plurality of stacked NAND dies and the substrate associated with the system in package, and wherein a second subset of the plurality of copper contacts are electrically isolated from the plurality of stacked NAND dies.

12. The molded memory device of claim 9, wherein at least one of:

the first mold exhibits a higher modulus of elasticity than the second mold, the first mold exhibits a higher coefficient of thermal expansion than the second mold, or the first mold exhibits a lower thermal conductivity than the second mold.

13. A method, comprising:

surrounding a first portion of a first die with a first mold compound;

adhering at least a second die to the first die, thereby forming a die stack;

electrically coupling the first die to the at least the second die via a plurality of wire bonds; and surrounding the die stack with a second mold compound, thereby encapsulating the plurality of wire bonds in the second mold compound and forming a molded die assembly.

14. The method of claim 13, further comprising:

forming a plurality of via holes in the first mold compound; and filling the plurality of via holes with a conductive material, thereby forming a plurality of contacts.

15. The method of claim 14, further comprising electrically coupling the die stack to a subset of the plurality of contacts via the plurality of wire bonds.

16. The method of claim 14, further comprising:

forming a through mold via in the second mold compound; and electrically coupling the through mold via to a contact, of the plurality of contacts.

17. The method of claim 16, further comprising:

adhering another molded die assembly to the molded die assembly; and electrically coupling the other molded die assembly to the through mold via.

18. The method of claim 13, further comprising coupling the molded die assembly to a substrate associated with a system in package via a plurality of micro balls.

19. The method of claim 18, wherein coupling the molded die assembly to the substrate associated with the system in package via the plurality of micro balls includes forming an electrical connection between the die stack and the substrate via a first subset of the plurality of micro balls, and electrically isolating the die stack from a second subset of the plurality of micro balls.

20. The method of claim 18, further comprising coupling another molded die assembly to the substrate associated with the system in package.

* * * * *